US012707777B2

(12) United States Patent
Zhang et al.

(10) Patent No.: US 12,707,777 B2
(45) Date of Patent: Aug. 11, 2026

(54) LIGHT-EMITTING SUBSTRATE HAVING FIRST OPTICAL BODIES AND METHOD OF MANUFACTURING THE SAME, DISPLAY PANEL

(71) Applicant: BOE TECHNOLOGY GROUP CO., LTD., Beijing (CN)

(72) Inventors: Can Zhang, Beijing (CN); Can Wang, Beijing (CN); Minghua Xuan, Beijing (CN); Xiaochuan Chen, Beijing (CN); Ning Cong, Beijing (CN); Jinfei Niu, Beijing (CN); Jingjing Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 423 days.

(21) Appl. No.: 18/261,958

(22) PCT Filed: Jul. 19, 2022

(86) PCT No.: PCT/CN2022/106569

§ 371 (c)(1),
(2) Date: Jul. 18, 2023

(87) PCT Pub. No.: WO2024/016180

PCT Pub. Date: Jan. 25, 2024

(65) Prior Publication Data

US 2024/0405172 A1 Dec. 5, 2024

(51) Int. Cl.
*H10H 20/855* (2025.01)
*H10H 20/01* (2025.01)
(Continued)

(52) U.S. Cl.
CPC .......... *H10H 20/855* (2025.01); *H10H 20/01* (2025.01); *H10H 20/811* (2025.01);
(Continued)

(58) Field of Classification Search
CPC .... H10H 20/855; H10H 20/01; H10H 20/811; H10H 20/852; H10H 20/857; H01L 25/0753
See application file for complete search history.

(56) References Cited

U.S. PATENT DOCUMENTS

2010/0258822 A1 10/2010 Kobayashi
2019/0355704 A1 11/2019 Cheng et al.
(Continued)

FOREIGN PATENT DOCUMENTS

CN 110416247 A 11/2019
CN 110429097 A 11/2019
CN 113345880 A 9/2021

OTHER PUBLICATIONS

Zhai et al., CN 110429097 A, machine translation,2019 (Year: 2019).*

(Continued)

*Primary Examiner* — Tracie Y Green
(74) *Attorney, Agent, or Firm* — XSENSUS LLP

(57) ABSTRACT

The present disclosure provides a light-emitting substrate. The light-emitting substrate includes a backboard, a light-emitting layer and a plurality of first optical bodies. The light-emitting layer is located on a side of the backboard; the light-emitting layer includes a plurality of light-emitting units, and the plurality of light-emitting units are arranged in an array. Each first optical body includes a first optical portion and a second optical portion; a gap between two adjacent light-emitting units is filled with the first optical portion, and the second optical portion is located on a side of the light-emitting layer away from the backboard, and is connected to the first optical portion. The second optical portion includes a first surface extending outwards from an edge of the first optical portion.

20 Claims, 13 Drawing Sheets

(51) Int. Cl.
*H10H 20/811* (2025.01)
*H10H 20/852* (2025.01)
*H10H 20/857* (2025.01)
*H10W 90/00* (2026.01)

(52) U.S. Cl.
CPC ........ *H10H 20/852* (2025.01); *H10H 20/857* (2025.01); *H10W 90/00* (2026.01); *H10H 20/032* (2025.01); *H10H 20/0363* (2025.01)

(56) References Cited

U.S. PATENT DOCUMENTS

| | | | | |
|---|---|---|---|---|
| 2020/0259050 | A1 | 8/2020 | Wu et al. | |
| 2021/0111325 | A1 | 4/2021 | Kim et al. | |
| 2023/0420431 | A1 * | 12/2023 | Wei ...................... | H10H 20/857 |

OTHER PUBLICATIONS

International Search Report and Written Opinion for the PCT Application No. PCT/CN2023/100004 by the International Searching Authority on Sep. 18, 2023.

* cited by examiner

LIGHT-EMITTING SUBSTRATE HAVING FIRST OPTICAL BODIES AND METHOD OF MANUFACTURING THE SAME, DISPLAY PANEL

CROSS-REFERENCE TO RELATED APPLICATION

The present application is a national phase entry under 35 USC 371 of International Patent Application No. PCT/CN2022/1106569, filed on Jul. 19, 2022, which is incorporated herein by reference in its entirety.

TECHNICAL FIELD

The present disclosure relates to the field of display technologies, and in particular, to a light-emitting substrate and a method of manufacturing the same, and a display panel.

BACKGROUND

A light emitting diode (LED) is a type of semiconductor diode, which is a photoelectric element that emits light by a unilateral conductivity of a PN junction of a semiconductor. The LED is a lighting element that has been widely used in the market all over the world at present. The LED is deeply loved by consumers due to its advantages of small size, high luminance, low power consumption, low heat production, long service life, environmental protection, color diversity and the like.

SUMMARY

In an aspect, a light-emitting substrate is provided. The light-emitting substrate includes a backboard, a light-emitting layer and a plurality of first optical bodies. The light-emitting layer is located on a side of the backboard; the light-emitting layer includes a plurality of light-emitting units, and the plurality of light-emitting units are arranged in an array. Each first optical body includes a first optical portion and a second optical portion; a gap between two adjacent light-emitting units is filled with the first optical portion, and the second optical portion is located on a side of the light-emitting layer away from the backboard, and is connected to the first optical portion. The second optical portion includes a first surface extending outwards from an edge of the first optical portion.

In some embodiments, an orthographic projection of the first surface on the backboard is located within an orthographic projection of a light-emitting unit of the two adjacent light-emitting units on the backboard.

In some embodiments, orthographic projections, on the backboard, of first surfaces of at least two first optical bodies are located within an orthographic projection of a same light-emitting unit on the backboard.

In some embodiments, the first surface is a plane, and a slope angle of the first surface relative to the backboard is in a range of 40° to 80°.

In some embodiments, the light-emitting substrate further includes a common electrode layer. The common electrode layer is located on the side of the light-emitting layer away from the backboard; the common electrode layer covers the plurality of light-emitting units and the plurality of first optical bodies.

In some embodiments, the light-emitting substrate further includes a plurality of second optical bodies. The plurality of second optical bodies are located on a surface of the common electrode layer away from the backboard; a refractive index of a second optical body is greater than a refractive index of a first optical body. An orthographic projection of the second optical body on the backboard is located within an orthographic projection of a light-emitting unit on the backboard.

In some embodiments, an area of a surface, proximate to the backboard, of the second optical body is greater than an area of a surface, away from the backboard, of the second optical body.

In some embodiments, the plurality of light-emitting units are arranged in a plurality of rows and a plurality of columns. In a direction parallel to an arrangement direction of a row of light-emitting units, first optical bodies and second optical bodies are alternately arranged; and/or in a direction parallel to an arrangement direction of a column of light-emitting units, first optical bodies and second optical bodies are alternately arranged.

In some embodiments, a surface of the second optical body away from the backboard and a portion of the surface of the common electrode layer away from the backboard constitute a continuous surface.

In some embodiments, a refractive index of the common electrode layer is greater than the refractive index of the first optical body, and the refractive index of the second optical body is greater than the refractive index of the common electrode layer.

In some embodiments, a light-emitting unit includes a first semiconductor layer, a multi-quantum-well layer and a second semiconductor layer. The first semiconductor layer, the multi-quantum-well layer and the second semiconductor layer are sequentially stacked in a direction away from the backboard. The first semiconductor layer includes a P-type doped material, and the second semiconductor layer includes an N-type doped material.

In some embodiments, the light-emitting substrate further includes second optical bodies and a common electrode layer. A refractive index of the common electrode layer, a refractive index of a first optical body and a refractive index of a second optical body are all less than a refractive index of the second semiconductor layer.

In some embodiments, the light-emitting substrate further includes a control electrode layer. The control electrode layer includes a plurality of control electrodes; the plurality of control electrodes are respectively coupled to the plurality of light-emitting units. The control electrode layer is at least partially located in the backboard.

In some embodiments, the light-emitting substrate further includes a bonding conductive layer. The bonding conductive layer is located between the light-emitting layer and the backboard; the bonding conductive layer includes a plurality of bonding conductive portions. A bonding conductive portion is coupled to a control electrode and a light-emitting unit.

In some embodiments, the light-emitting substrate further includes an adhesive layer and a cover plate. The adhesive layer is located on a side of the first optical bodies away from the backboard. The cover plate is located on a side of the adhesive layer away from the backboard and covers the light-emitting layer and the first optical bodies.

In some embodiments, the backboard is a silicon substrate.

In another aspect, a display panel is provided. The display panel includes the light-emitting substrate as described in any one of the above embodiments.

In yet another aspect, a method of manufacturing a light-emitting substrate is provided. The method includes: forming a light-emitting layer on a backboard, the light-emitting layer including a plurality of light-emitting units that are arranged at intervals; and forming a plurality of first optical bodies. Each first optical body includes a first optical portion and a second optical portion; a gap between two adjacent light-emitting units is filled with the first optical portion, and the second optical portion is located on a side of the light-emitting layer away from the backboard, and is connected to the first optical portion. The second optical portion includes a first surface extending outwards from an edge of the first optical portion.

In some embodiments, forming the plurality of first optical bodies includes: performing a filling process with a first optical material, a gap between every two adjacent light-emitting units being filled with the first optical material, and the first optical material covering surfaces of the plurality of light-emitting units away from the backboard; and removing part of the first optical material on the surfaces of the light-emitting units away from the backboard to form the plurality of first optical bodies.

In some embodiments, before the light-emitting layer is formed on the backboard, the method further includes: providing a silicon substrate; forming a second semiconductor mother layer, a multi-quantum-well mother layer and a first semiconductor mother layer sequentially on the silicon substrate; bonding the first semiconductor mother layer to the backboard by a bonding conductive mother layer, the bonding conductive mother layer being located between the first semiconductor mother layer and the backboard; and removing the silicon substrate.

In some embodiments, forming the light-emitting layer on the backboard includes: patterning the second semiconductor mother layer, the multi-quantum-well mother layer and the first semiconductor mother layer to form the plurality of light-emitting units that are arranged at intervals; and patterning the bonding conductive mother layer to form a bonding conductive layer. The bonding conductive layer includes a plurality of bonding conductive portions that are arranged at intervals, and the plurality of bonding conductive portions are respectively coupled to the plurality of light-emitting units.

In some embodiments, after the first optical bodies are formed, the method further includes: forming a common electrode layer on a side of the first optical bodies away from the backboard, the common electrode layer covering the plurality of light-emitting units and the plurality of first optical bodies; and forming a plurality of second optical bodies that are arranged at intervals on the common electrode layer. An orthographic projection of a second optical body on the backboard is located within an orthographic projection of a light-emitting unit on the backboard.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
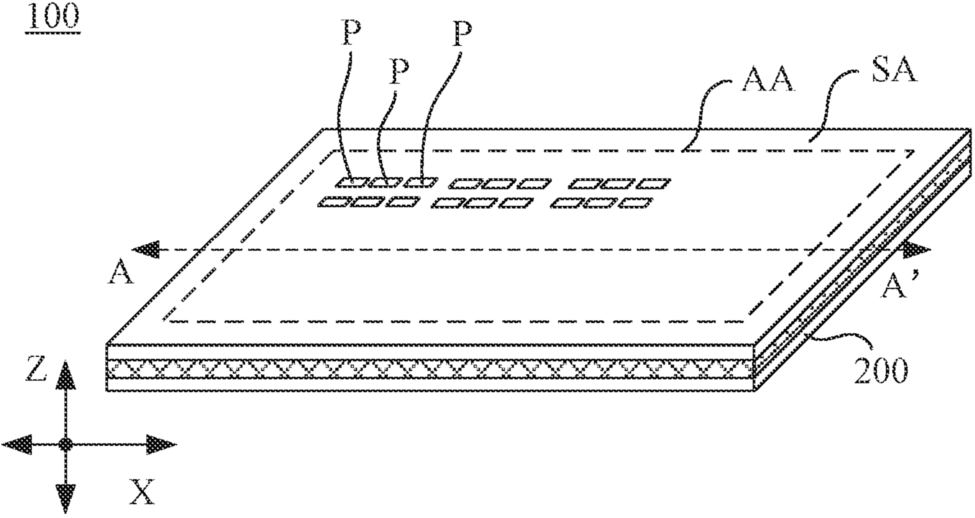
FIG. 1 is a perspective view of a display panel, in accordance with some embodiments.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to" In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of" or "the plurality of" means two or more unless otherwise specified.

In the description of some embodiments, the terms such as "coupled" and "connected" and derivatives thereof may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining that" or "in response to detecting", depending on the context. Similarly, depending on the context, the phrase "if it is determined that" or "if [a stated condition or event] is detected" is optionally construed as "in a case where it is determined that", "in response to determining that", "in a case where [the stated condition or event] is detected", or "in response to detecting [the stated condition or event]".

The phrase "applicable to" or "configured to" as used herein indicates an open and inclusive expression, which does not exclude devices that are applicable to or configured to perform additional tasks or steps.

Additionally, the phase "based on" as used herein is meant to be open and inclusive, since a process, a step, a calculation or other action that is "based on" one or more of the stated conditions or values may, in practice, be based on additional conditions or values beyond those stated.

As used herein, the term such as "about", "substantially" or "approximately" includes a stated value and an average value within an acceptable range of deviation of a particular value. The acceptable range of deviation is determined by a person of ordinary skill in the art in view of measurement in question and errors associated with measurement of a particular quantity (i.e., limitations of a measurement system).

As used herein, the term such as "parallel", "perpendicular" or "equal" includes a stated condition and a condition similar to the stated condition, a range of the similar condition is within an acceptable range of deviation, and the acceptable range of deviation is determined by a person of ordinary skill in the art in view of measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; the term "equal" includes absolute equality and approximate equality, and an acceptable range of deviation of the approximate equality may be that, for example, a difference between the two that are equal is less than or equal to 5% of either of the two.

It will be understood that, in a case where a layer or an element is referred to as being on another layer or a substrate, it may be that the layer or the element is directly on the another layer or the substrate, or there may be a middle layer between the layer or the element and the another layer or the substrate.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

A light emitting diode (LED) has a unilateral conductivity. A luminous principle of the LED is that, after a direct voltage is supplied for the LED, holes and electrons in the LED recombine within a few microns near a PN junction, and photons are generated (that is, fluorescence of a spontaneous radiation is generated) when the electrons and the holes disappear. An energy state (a band gap) where electrons and holes in a different semiconductor material are located is different, so that energy released when the electrons and the holes recombine is different. The greater energy between the electrons and the holes, the greater energy of generated photons. The energy of the photons corresponds to a color of light. A different material has a different band gap, so as to emit light of a different color. LED chips are a type of solid semiconductor device, which may achieve luminescence display of LEDs.

According to the research of the inventors of the present disclosure, it is found that, at present, a divergence angle of exited light of an LED in a display substrate is relatively large, so that a light extraction efficiency of an LED display panel in a direction perpendicular to a light exit surface is relatively low.

In light of this, some embodiments of the present disclosure provide a light-emitting substrate and a method of manufacturing the same, and a display panel, which will be respectively described below.

FIG. 1 is a perspective view of a display panel, in accordance with some embodiments. The display panel 100 includes a display region AA for displaying images and a non-display region SA not for displaying images, and the non-display region SA is located on at least one side of the non-display region SA. In some examples, the non-display region SA may enclose the display region AA. Alternatively, the non-display region SA may be located outside the display region AA in at least one direction.

The display panel 100 may be, in a plan view, in a shape of a rectangle, a circle, an ellipse, a rhombus, a trapezoid, a square or other shapes according to display needs. The display region AA includes a plurality of sub-pixel regions P, and the plurality of sub-pixel regions P are arranged in an array. For example, the plurality of sub-pixel regions P are arranged in multiple rows and multiple columns.

A display apparatus includes the display panel 100. The display apparatus is a product having a function of displaying images (including an image in stationary or an image in motion (which may be a video)). For example, the display apparatus may be any electronic product of a display, a television, a billboard, a digital photo frame, a laser printer having a display function, a telephone, a mobile phone, a painted screen, a personal digital assistant (PDA), a digital camera, a portable camcorder, a view finder, a navigator, a vehicle, a large-area wall, an information inquiry device (e.g., a business inquiry device for a department of e-government, bank, hospital, electricity or the like) and a monitor. For another example, the display apparatus may be any electronic product of a micro display, and a virtual reality (VR) device and an augmented reality (AR) device each including a micro display. The electronic products as described above may merely represent examples for applying the display apparatus. It will be understood by a person of ordinary skill in the art that the display apparatus may be other electronic products without departing from the spirit and the scope of the present disclosure.

In some embodiments, the AR device requires a relatively high light extraction efficiency upon a front (i.e., in a direction perpendicular to the display panel 100) of the display panel 100. The display panel provided in the embodiments of the present disclosure may improve a display effect of the AR device by improving the light extraction efficiency upon the front of the display panel.

Figure 2:
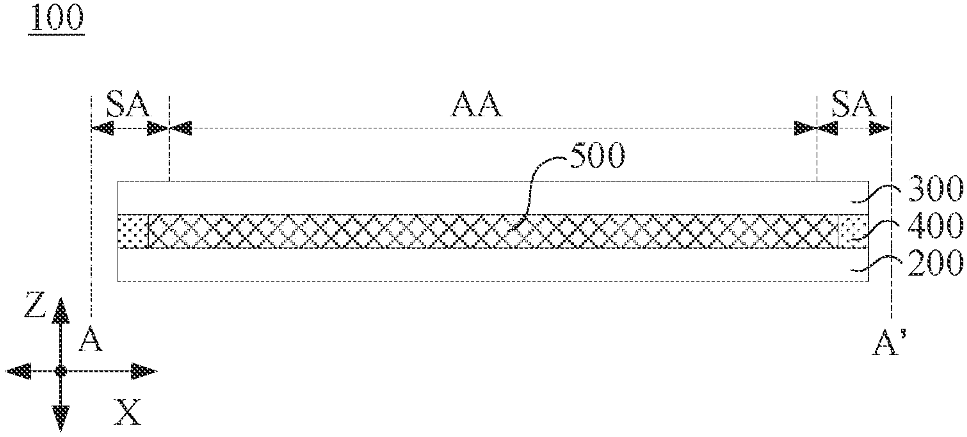
FIG. 2 is a sectional view taken along the line A-A' in FIG. 1.

FIG. 2 is a sectional view taken along the line A-A' in FIG. 1. The display panel 100 includes a light-emitting substrate 200, a color converting substrate 300 located on a light exit side of the light-emitting substrate 200, a sealing layer 400 for sealing both the light-emitting substrate 200 and the color converting substrate 300, and a filling layer 500 filled between the light-emitting substrate 200 and the color converting substrate 300.

The color converting substrate 300 may be opposite to the light-emitting substrate 200. The color converting substrate 300 may include a color converting structure used for converting a color of incident light. The color converting structure may include at least one of a color filter and a wavelength converting pattern.

The sealing layer 400 may be located between the light-emitting substrate 200 and the color converting substrate 300 and in the non-display region SA. The sealing layer 400 may be disposed, in the non-display region SA, along edges of the light-emitting substrate 200 and the color converting substrate 300, so as to surround a periphery of the display region AA or be around the periphery of the display region AA in the plan view. The sealing layer 400 may be made of an organic material such as an epoxy resin, which is not limited thereto.

The filling layer 500 may be located in a space that is between the light-emitting substrate 200 and the color converting substrate 300 and enclosed by the sealing layer 400, and the space is filled with the filling layer 500. The filling layer 500 may be made of a material capable of transmitting light. The filling layer 500 may be made of an organic material such as a silicon-based organic material or an epoxy-based organic material, which is not limited thereto. In some embodiments, the filling layer may be not provided.

The display panel 100 may be any one of an LED display panel, a mini LED display panel, a micro LED display panel or the like.

The display panel 100 includes a plurality of sub-pixel regions disposed in the display region AA. A sub-pixel region is a smallest region of which luminance is controllable. As an example, the plurality of sub-pixel regions include first sub-pixel regions configured to emit light of a first color, second sub-pixel regions configured to emit light of a second color and third sub-pixel regions configured to emit light of a third color; the first color, the second color and the third color may be three primary colors. For example, the first color, the second color and the third color are a red color, a green color and a blue color, respectively. Correspondingly, the plurality of sub-pixel regions include red sub-pixel regions, green sub-pixel regions and blue sub-pixel regions. As another example, the plurality of sub-pixel regions may include fourth sub-pixel regions emitting white light.

Figure 3:
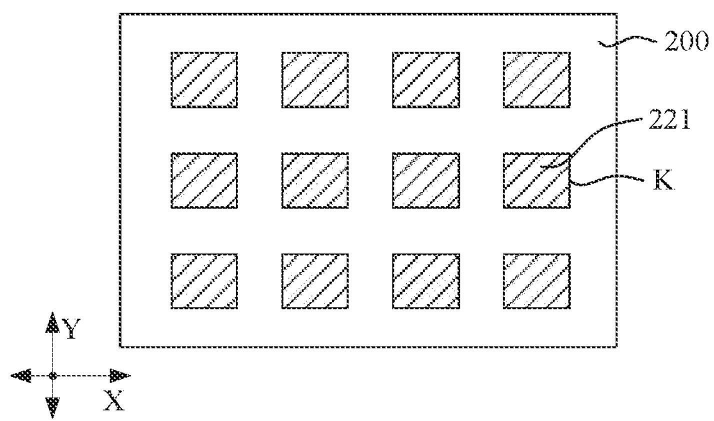
FIG. 3 is a top view showing light-emitting units in a light-emitting substrate, in accordance with some embodiments.

As shown in FIG. 3, the light-emitting substrate 200 includes a plurality of light-emitting regions K disposed in the display region AA, and a light-emitting region K corresponds to a sub-pixel region P. As an example, the plurality of light-emitting regions K are configured to emit light of a same color. In addition, an intensity of light emitted from a different light-emitting region K may be different.

The color converting substrate 300 includes a plurality of color converting regions disposed in the display region AA, and a color converting region corresponds to a sub-pixel region. As an example, the plurality of color converting regions include first color converting regions configured to convert light provided in light-emitting regions into light of a first color, second color converting regions configured to convert light provided in another light-emitting regions into light of a second color, and third color converting regions configured to convert light provided in yet another light-emitting regions into light of a third color. As another example, the plurality of color converting regions may include light-transmitting regions through which light provided in yet another light-emitting regions passes.

Figure 4:
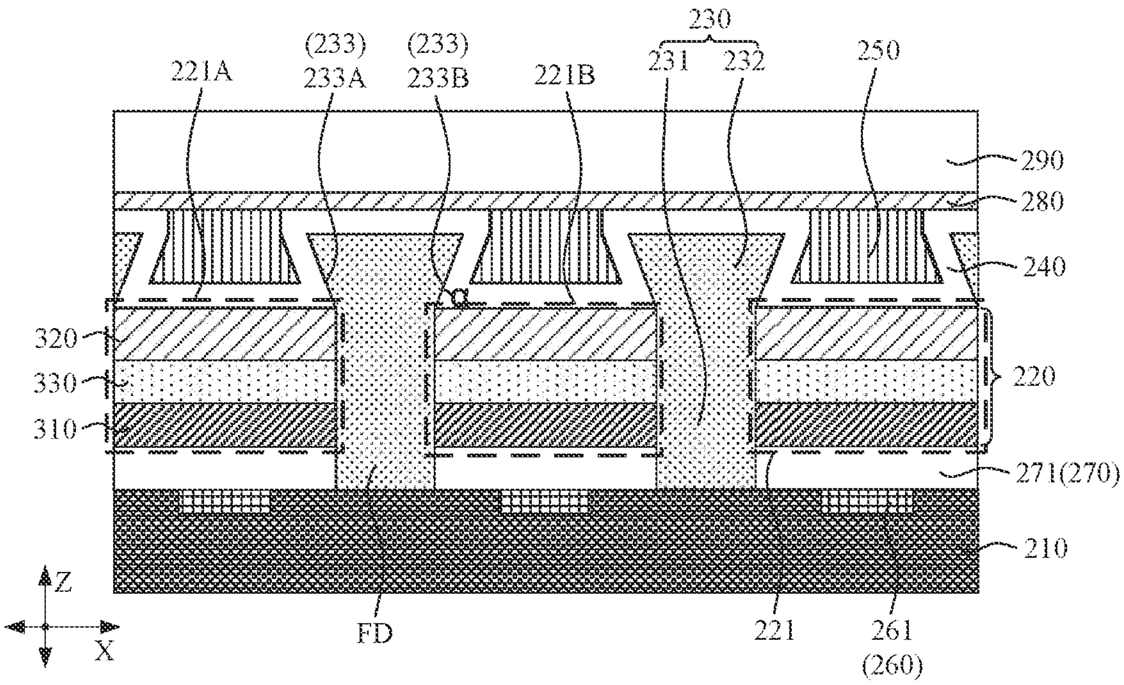
FIG. 4 is a sectional view of a light-emitting substrate, in accordance with some embodiments.

With continued reference to FIG. 4, in some embodiments, the light-emitting substrate 200 includes a backboard 210, a light-emitting layer 220 and first optical bodies 230. The light-emitting layer 220 and the first optical bodies 230 are located on a same side of the backboard 210. The light-emitting layer 220 and the first optical bodies 230 are located in the display region AA.

The backboard 210 may include silicon such as polysilicon or monocrystalline silicon. The backboard 210 may be also referred to as a silicon substrate or a silicon-based backboard.

The light-emitting layer 220 includes a plurality of light-emitting units 221. For example, as shown in FIG. 4, the plurality of light-emitting units 221 may be arranged in an array (arranged in a plurality of rows and a plurality of columns). For example, light-emitting units 221 in a row are arranged in a first direction X. For another example, light-emitting units 221 in a column are arranged in a second direction Y.

The plurality of light-emitting units 221 are located in the plurality of light-emitting regions, and light-emitting unit(s) 221 serve as a light source of a light-emitting region. For example, each light-emitting region has a same number of light-emitting units 221. The content herein is described by taking an example where a light-emitting region K includes a light-emitting unit 221, which is not limited thereto.

The backboard 210 includes a plurality of pixel circuits. A pixel circuit may be coupled to a light-emitting unit 221 in a light-emitting region K. A different pixel circuit is coupled to a different light-emitting unit 221. The pixel circuit may provide a light-emitting driving electrical signal for the light-emitting unit 221, so as to drive the light-emitting unit 221 to emit light.

The different pixel circuit may provide a different light-emitting driving electrical signal for the different light-emitting unit 221, which makes the light-emitting unit 221 located in a different light-emitting region emit light with a different intensity, thereby achieving bright-dark display of the display panel 100.

In some examples, all the pixel circuits are located in the light-emitting regions. In some other examples, of all the pixel circuits, a part may be located in the light-emitting regions, and the other part may be located outside the light-emitting regions, and the embodiments of the present disclosure are not limited thereto.

In some embodiments, a dimension of each light-emitting unit 221 in a third direction Z may be less than 30 μm.

As shown in FIG. 4, in some embodiments, the light-emitting unit 221 may include a first semiconductor layer 310, a second semiconductor layer 320 and a multi-quantum-well layer 330. In a direction that is perpendicular to the backboard (e.g., the third direction Z) and away from the backboard 210, the first semiconductor layer 310, the multi-quantum-well layer 330 and the second semiconductor layer 320 are stacked in sequence.

The first semiconductor layer 310 may include a P-type doped material, and thus the first semiconductor layer 310 may be also referred to as a P-type semiconductor layer. For example, the P-type semiconductor layer may include P-type gallium nitride (P-GaN).

The second semiconductor layer 320 may include an N-type doped material, and thus the second semiconductor layer 320 may be also referred to as an N-type semiconductor layer. For example, the N-type semiconductor layer may include N-type gallium nitride (N-GaN).

In some examples, a dimension of the second semiconductor layer 320 in the third direction Z may be greater than a dimension of the first semiconductor layer 310 in the third direction Z.

After a direct voltage is supplied for the light-emitting unit 221, holes in the first semiconductor layer 310 and electrons in the second semiconductor layer 320 recombine in the multi-quantum-well layer 330, so as to achieve light emission.

In some examples, a refractive index of the second semiconductor layer 320 may be in a range from 2.1 to 2.5, such as 2.1, 2.14, 2.2, 2.23, 2.28, 2.3, 2.36, 2.4, 2.45 or 2.5.

As shown in FIG. 4, in some embodiments, the light-emitting substrate 200 further includes a common electrode layer 240 and a control electrode layer 260. The common electrode layer 240 and the control electrode layer 260 are both coupled to the light-emitting units 221, so as to supply the direct voltage for the light-emitting units.

In some examples, the common electrode layer 240 is located on a side of the light-emitting layer 220 away from the backboard 210, and the control electrode layer 260 is located on a side of the light-emitting layer 220 proximate to the backboard 210.

In some embodiments, the light-emitting substrate 200 is applied to a top-emission display panel. The common electrode layer 240 may be a light-transmitting electrode, and a refractive index of the common electrode layer 240 may be in a range from 1.4 to 1.8, such as 1.4, 1.45, 1.5, 1.53, 1.6, 1.66, 17, 1.74, 1.78 or 1.8.

For example, the refractive index of the common electrode layer 240 is less than the refractive index of the second semiconductor layer 320.

As shown in FIG. 4, in some examples, the common electrode layer 240 is of a whole-layer structure and covers the plurality of light-emitting units 221, so as to provide a same first voltage (e.g., a cathode voltage) for second semiconductor layers 320 of the plurality of light-emitting units 221.

Figure 5:
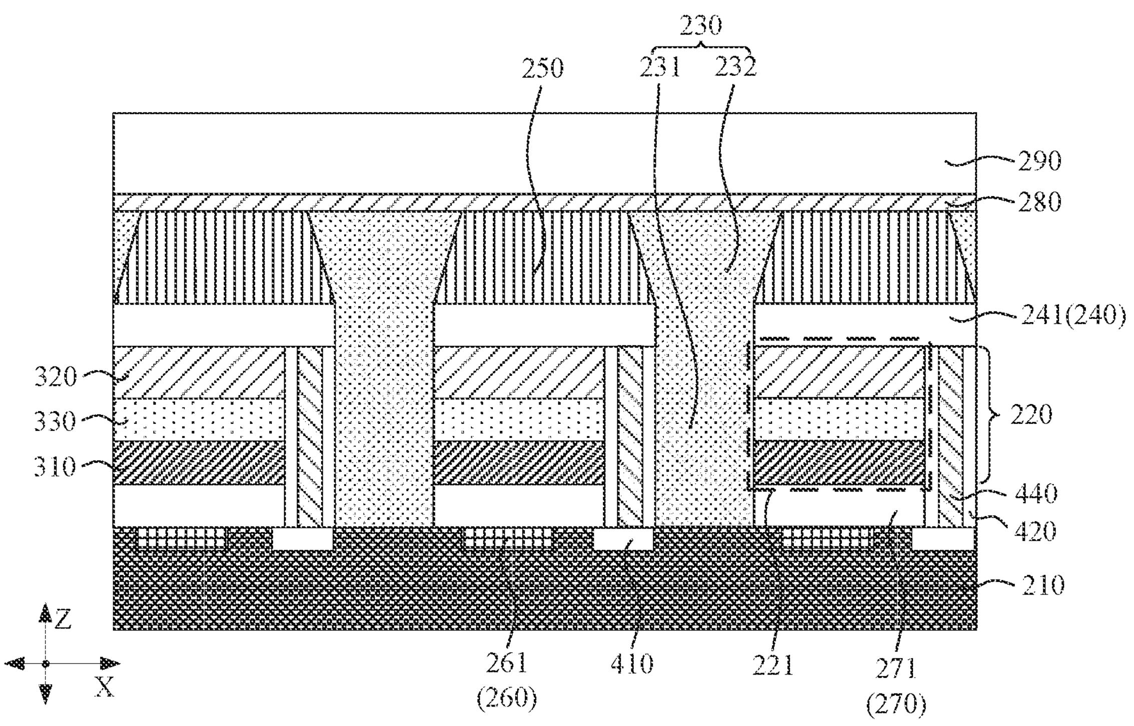
FIG. 5 is a sectional view of another light-emitting substrate, in accordance with some embodiments.

As shown in FIG. 5, in some other examples, the common electrode layer 240 includes a plurality of common electrode portions 241 that are separated from one another. The plurality of common electrode portions 241 are respectively coupled to the plurality of light-emitting units 221. On this basis, the light-emitting substrate 200 may further include a plurality of conductive structures 440 and a plurality of common electrodes 410. A conductive structure 440 extends in the third direction Z, and two ends thereof are respectively coupled to a common electrode portion 241 and a common electrode 410. The common electrode 410 may be at least partially located in the backboard 210. The common electrode 410 provides a first voltage for a common electrode portion 241 through a conductive structure 440.

The plurality of common electrodes 410 may provide the same first voltages or different first voltages for the plurality of common electrode portions 241, respectively, which is not limited here.

In addition, as shown in FIG. 5, the light-emitting substrate 200 may further include insulating sleeves 420. An insulating sleeve 420 surrounds a conductive structure 440 and exposes an end of the conductive structure 440 coupled to a common electrode portion 241 and an end of the conductive structure 440 coupled to a common electrode 410. In this way, the insulating sleeve 420 may prevent the conductive structure 440 from providing the first voltage for other components therearound.

In some examples, the insulating sleeve 420 may include silicon nitride or other suitable material.

In some examples, as shown in FIG. 5, the conductive structure 440 is in contact with a surface of a second semiconductor layer 320 proximate to the backboard 210. In some other examples, the conductive structure 440 bypasses the insulating sleeve 420 and is coupled to a surface of the second semiconductor layer 320 away from the backboard 210.

In some examples, as shown in FIG. 5, an orthographic projection of the common electrode portion 241 on the backboard 210 covers an orthographic projection of the common electrode 410 on the backboard 210. On this basis, the orthographic projection of the common electrode portion 241 on the backboard 210 may cover an orthographic projection of the light-emitting unit 221 on the backboard 210, an orthographic projection of the conductive structure 440 on the backboard 210 and an orthographic projection of the insulating sleeve 420 on the backboard 210.

As shown in FIGS. 4 and 5, in some embodiments, the control electrode layer 260 includes a plurality of control electrodes 261 that are separated from one another. The plurality of control electrodes 261 are respectively coupled to the plurality of light-emitting units 221. The plurality of control electrodes 261 may provide different second voltages (e.g., anode voltages) or the same second voltages for the plurality of light-emitting units 221, respectively.

For example, in a case where the common electrode layer 240 provides the same first voltages for the plurality of light-emitting units 221, respectively, the plurality of control electrodes 261 may provide the different second voltages for the plurality of light-emitting units 221, respectively, so that the plurality of light-emitting units 221 may each have a different direct voltage and emit light with a different intensity.

In some examples, each control electrode 261 may be coupled to a pixel circuit, so as to provide a second voltage for a light-emitting unit 221.

In some embodiments, the control electrode layer 260 is at least partially located in the backboard 210. It will be understood that the control electrode 261 is at least partially located in the backboard 210.

In some examples, a portion of the control electrode 261 extends into the backboard 210, and another portion of the control electrode 261 protrudes outwards relative to the backboard 210 and provides the second voltage for the light-emitting unit 221. In this case, the control electrode 261 is partially located in the backboard 210.

In some examples, the control electrodes 261 are all located in the backboard 210. For example, as shown in FIG. 4, a surface, proximate to the light-emitting unit 221, of the control electrode 261 and a surface, proximate to the light-emitting unit 221, of the backboard 210 constitute a continuous surface. That is, the surface, proximate to the light-emitting unit 221, of the control electrode 261 and the surface, proximate to the light-emitting unit 221, of the backboard 210 are connected and have no level difference therebetween.

In some examples, as shown in FIGS. 4 and 5, an orthographic projection of a control electrode 261 on the backboard 210 at least partially overlaps with an orthographic projection, on the backboard 210, of a light-emitting unit 221 to which the control electrode 261 is coupled.

For example, the orthographic projection of the control electrode 261 on the backboard 210 is located within the orthographic projection, on the backboard 210, of the light-emitting unit 221 to which the control electrode 261 is coupled.

In a case where the light-emitting substrate 200 includes both the control electrodes 261 and the common electrodes 410, orthographic projections, on the backboard 210, of a control electrode 261 and a common electrode that are coupled to a same light-emitting unit 221 are both located within an orthographic projection of the light-emitting unit 221 on the backboard 210.

In some embodiments, as shown in FIGS. 4 and 5, the light-emitting substrate 200 further includes a bonding conductive layer 270. The bonding conductive layer 270 is located between the light-emitting layer 220 and the backboard 210. The bonding conductive layer 270 includes a plurality of bonding conductive portions 271, and a bonding conductive portion 271 is coupled to a control electrode 261 and a light-emitting unit 221.

For example, an orthographic projection of the control electrode 261 on the backboard 210 is located within an orthographic projection of the bonding conductive portion 271 on the backboard 210. In this way, it is possible to improve an effect of which the bonding conductive portion 271 obtains the second voltage from the control electrode 261.

The orthographic projection of the bonding conductive portion 271 on the backboard 210 at least partially coincides with an orthographic projection of the light-emitting unit 221 on the backboard 210. For example, the orthographic projection of the bonding conductive portion 271 on the backboard 210 is located within the orthographic projection of the light-emitting unit 221 on the backboard 210. For another example, the orthographic projection of the bonding conductive portion 271 on the backboard 210 is completely coincides with the orthographic projection of the light-emitting unit 221 on the backboard 210.

The bonding conductive portion 271 may transmit the second voltage provided by the control electrode 261 to the first semiconductor layer. A material of the bonding conductive layer 270 may include a metal material such as silver (Ag) or copper (Cu). The metal material has a relatively low impedance, which may improve a transmission efficiency of the second voltage, and furthermore, the metal layer may reflect light emitted from the light-emitting unit 221, thereby improving the light exit efficiency of the light-emitting substrate 200.

As shown in FIGS. 4 and 5, in some embodiments, first optical bodies 230 are each inserted between two adjacent light-emitting units 221. The first optical body 230 may include a light-transmitting organic material. The first optical body 230 may include at least one of organic materials such as an optical clear adhesive (OCA) or an optical clear resin (OCR).

As shown in FIG. 4, the first optical bodies 230 each include a first optical portion 231 and a second optical portion 232. The first optical portion 231 is located between the second optical portion 232 and the backboard 210. In some examples, the first optical portion 231 may be in direct contact with the backboard 210.

A gap between the two adjacent light-emitting units 221 is filled with the first optical portion 231. It will be understood that sidewalls, in a direction (e.g., the first direction X) parallel to the backboard, of the first optical portion 231 are respectively in direct contact with the two adjacent light-emitting units 221. For example, the first optical portion 231 is in direct contact with the first semiconductor layer 310, the second semiconductor layer 320 and the multi-quantum-well layer 330.

In some examples, as shown in FIG. 4, a distance between a surface of the first optical portion 231 away from the backboard 210 and the backboard 210 is approximately equal to a distance between a surface of the light-emitting unit away from the backboard 210 and the backboard 210. It will be understood that the surface of the first optical portion 231 away from the backboard 210 and the surface of the light-emitting unit away from the backboard 210 constitute a continuous and substantially flat surface.

The second optical portion 232 is located on the side of the light-emitting layer 220 away from the backboard 210. It will be understood that the second optical portion 232 is located on a light exit side of the light-emitting layer 220.

As shown in FIG. 4, the second optical portion 232 includes first surfaces 233 each extending outward from an edge of the first optical portion 231. It will be understood that an included angle α formed between the first surface 233 and the surface of the light-emitting unit 221 away from the backboard 210 is an acute angle.

The first surface 233 is disposed toward one of the two adjacent light-emitting units, and extends in a direction from the edge of the first optical portion 231 toward a light-emitting unit. As shown in FIG. 4, the first surface 233A on the left side in FIG. 4 is disposed toward the light emitting unit 221A, and extends in a direction from the edge of the first optical portion 231 toward the light emitting unit 221A; the first surface 233B on the right side in FIG. 4 is disposed toward the light-emitting unit 221B, and extends in a direction from the edge of the first optical portion 231 toward the light-emitting unit 221B.

In some examples, in the first direction X, an average dimension of the second optical portion 232 is larger than an average dimension of the first optical portion 231.

In some examples, the second optical portion 232 may include a plurality of first surfaces 233, and different first surfaces 233 may toward different light emitting units 221. Shapes and areas of the plurality of first surfaces 233 of the same second optical portion 232 may respectively be the same or different, which is not limited here.

In some examples, as shown in FIG. 4, the orthographic projection of the first optical portion 231 on the backboard 210 is located within the orthographic projection of the second optical portion 232 on the backboard 210. It will be understood that orthographic projections of the plurality of first surfaces of the second optical portion 232 on the backboard 210 are located outside the orthographic projection of the first optical portion 231 on the backboard 210.

In some embodiments, an orthographic projection of a first surface 233 on the backboard 210 is located within an orthographic projection of a light emitting unit 221 on the backboard 210. It will be understood that the second optical portion 232 covers a portion of the light exit surface of the light-emitting unit 221, so that the light emitted by more light-emitting units may be optimized, so as to increase the amount of light emitted by the light-emitting unit in the third direction Z.

Figure 6:
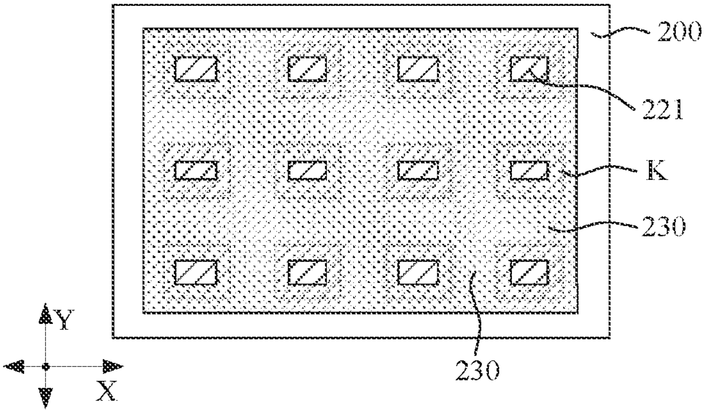
FIG. 6 is a top view showing light-emitting units and first optical bodies in a light-emitting substrate, in accordance with some embodiments.

As shown in FIG. 6, in some embodiments, in a plane defined by the first direction X and the second direction Y, first optical bodies 230 are provided on at least two sides of a same light-emitting unit 221. In this way, orthographic projections of first surfaces of the first optical bodies 230 on the at least two sides of the light-emitting unit 221 on the backboard 210 is located within the orthographic projection of the same light emitting unit 221 on the backboard 210.

For example, as shown in FIG. 6, the light-emitting unit 221 is in a shape of a rectangular volume. The light-emitting unit 221 is provided with a first optical body 230 all around. The four first optical bodies 230 all around surround the light-emitting unit 221, and orthographic projections of first surfaces of the four first optical bodies 230 on the backboard 210 are all located within the orthographic projection of the light-emitting unit 221 on the backboard 210.

In some embodiments, as shown in FIG. 4, the first surface 233 is a plane. A slope angle of the first surface 233 relative to the backboard is in a range of 40° to 80° such as 40°, 45°, 50°, 55°, 60°, 65°, 70°, 75° or 80°.

In some examples, the surface of the first optical portion 231 away from the backboard 210 is parallel to a plane where the backboard 210 is located. In this way, the slope angle between the first surface 233 and the surface of the first optical portion 231 away from the backboard is in the range of 40° to 80°.

Figure 7:
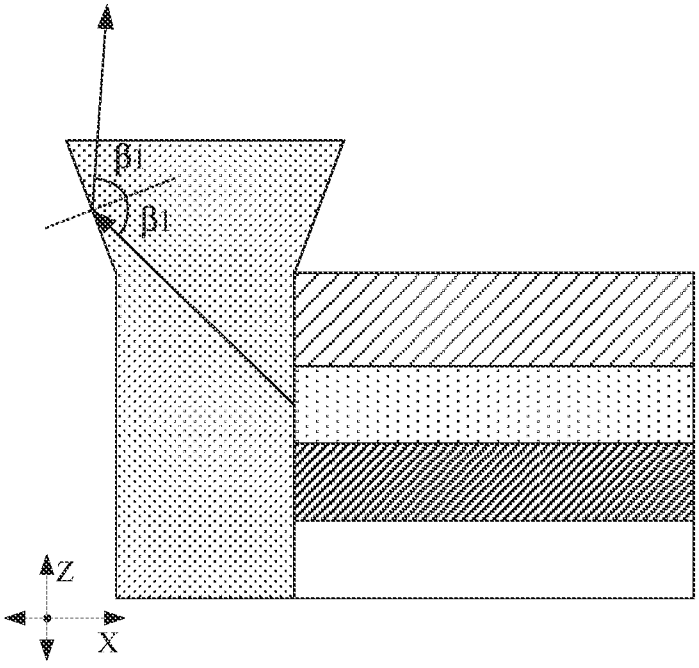
FIG. 7 is a diagram showing a path of a part of light in a light-emitting substrate, in accordance with some embodiments.

In this case, as shown in FIG. 7, the light emitted by the light-emitting unit may be reflected by the first surface in a direction away from the backboard, and an angle between the reflected light and the third direction Z is smaller than an angle between the incident light and the third direction Z. Thus, it is possible to improve the light extraction efficiency of the light-emitting substrate 200 in a direction perpendicular to the light exit surface of the light-emitting substrate 200, and improve the light extraction efficiency upon the front of the display panel 100.

Figure 8:
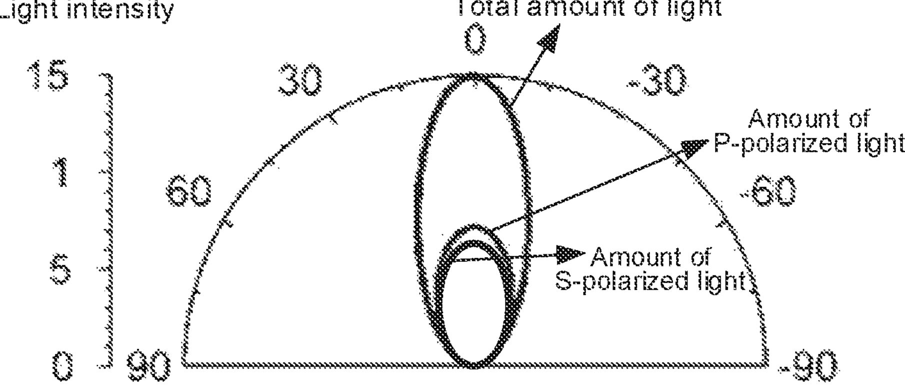
FIG. 8 is a diagram showing light intensities of light in a light-emitting substrate at different light exit angles, in accordance with some embodiments.

In some examples, in a case where the slope angle of the first surface 233 relative to the backboard 210 is 50°, as shown in FIG. 8, an included angle between the light (including a total amount of light, an amount of P-polarized light and an amount of S-polarized light) emitted by the light-emitting substrate 200 and a direction perpendicular to the light-emitting substrate 200 is limited within ±30°, so as to improve the light extraction efficiency of the light-emitting substrate 200 in the direction perpendicular to the light exit surface of the light-emitting substrate 200. [0134] in some embodiments, the first surface 233 is a curved surface. The curved surface may be concave toward the inside of the second optical portion 232. After the light emitted by the light-emitting unit 221 is reflected by the first surface 233, the angle between the reflected light and the third direction Z is smaller than the angle between the incident light and the third direction Z, so as to improve the light extraction efficiency of the light-emitting substrate 200 perpendicular to the light exit surface of the light-emitting substrate 200.

In some embodiments, the first surface 233 is a curved surface. The curved surface may be convex toward the outside of the second optical portion 232. After the light emitted by the light-emitting unit 221 is reflected by the first surface 233, the angle between the reflected light and the third direction Z is smaller than the angle between the incident light and the third direction Z, so as to improve the light extraction efficiency of the light-emitting substrate 200 perpendicular to the light exit surface of the light-emitting substrate 200.

In some embodiments, as shown in FIG. 4, the common electrode layer 240 covers the plurality of light-emitting units 221 and the plurality of first optical bodies 230.

The common electrode layer 240 may be a film structure with a uniform film thickness (a dimension in the third direction Z) at various positions of the light-emitting substrate 200. The common electrode layer 240 covers the plurality of light-emitting units 221, so as to provide the same common voltage for the plurality of light-emitting units 221.

The dimension of the common electrode layer 240 in the third direction Z may be in a range of 500 Å to 1000 Å, such as 500 Å, 550 Å, 600 Å, 650 Å, 700 Å, 750 Å, 800 Å, 850 Å, 900 Å, 950 Å, or 1000 Å.

Since the dimension of the second optical portion 232 in the first direction X is larger than the dimension of the first optical portion 231 in the first direction X, it is easy to cause the common electrode layer 240 to break at the first surfaces 233. By increasing the dimension of the common electrode layer 240 in the third direction Z, the dimension of the common electrode layer 240 in the third direction Z is in the range of 500 Å to 1000 Å, so that it is possible to prevent the common electrode layer 240 from breaking at the first surfaces 233, so as to improve the reliability of the light-emitting substrate 200.

As shown in FIG. 4, in some examples, an average distance between a portion of the common electrode layer 240 covering the light-emitting unit 221 and the backboard 210 is smaller than an average distance between a portion of the common electrode layer 240 covering the first optical body 230 and the backboard 210.

In some embodiments, as shown in FIGS. 4 and 5, the light-emitting substrate 200 further includes a plurality of second optical bodies 250. The plurality of second optical bodies 250 are located on a surface of the common electrode layer 240 away from the backboard 210. For example, the second optical bodies 250 are respectively located on surfaces of the portions of the common electrode layer 240 covering the light-emitting units 221 away from the backboard 210. The second optical bodies 250 may directly contact the common electrode layer 240.

In some examples, the second optical body 250 may include a light-transmitting inorganic material. The light-transmitting inorganic material may include silicon dioxide ($SiO_2$), silicon carbon nitride (SiCN), which is not limited here.

In some examples, the plurality of first optical bodies 230 and the plurality of second optical bodies 250 are alternately arranged in the first direction X. In some other examples, the plurality of first optical bodies 230 and the plurality of second optical bodies 250 are alternately arranged in the second direction Y.

In some examples, an orthographic projection of a second optical body 250 on the backboard 210 is located within an orthographic projection of a light-shielding unit 221 on the backboard 210.

In some examples, the orthographic projection of the second optical body 250 on the backboard 210 overlaps with an orthographic projection of at least one first surface 233 on the backboard 210.

In some embodiments, a refractive index of the second optical body 250 is greater than a refractive index of the first optical body 230. For example, the refractive index of the first optical body 230 is in a range of 1.3 to 1.7, such as 1.3, 1.4, 1.5, 1.6 or 1.7; the refractive index of the second optical body 250 is in a range of 1.5 to 2.2, such as 1.5, 1.7, 1.9, 2.0, 2.1, or 2.2.

For example, the refractive index of the first optical body 230 is 1.7, and the refractive index of the second optical body 250 is 2.0. For another example, the refractive index of the first optical body 230 is 1.3, and the refractive index of the second optical body 250 is 1.5.

For example, the refractive index of the first optical body 230, the refractive index of the second optical body 250 and the refractive index of the common electrode layer 240 are all smaller than the refractive index of the second semiconductor layer 320.

Figure 9:
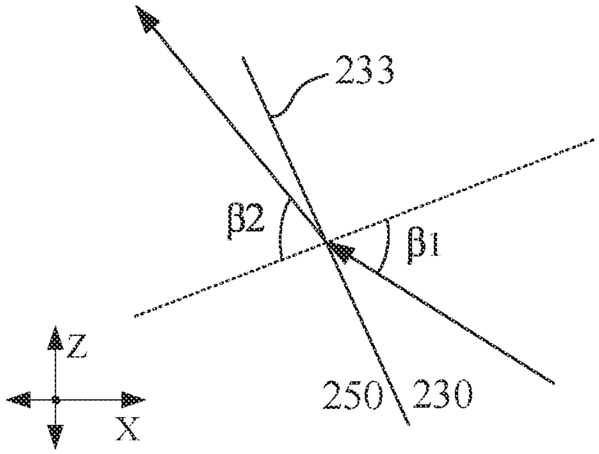
FIG. 9 is a diagram showing a path of another part of light in a light-emitting substrate, in accordance with some embodiments.

Since the light emitted by the light-emitting unit 221 enters the second optical body 250 through the common electrode layer 240 from the first optical body 230, in an example in which the common electrode layer 240 does not affect the light propagation direction, the common electrode layer 240 is not analyzed during the analysis of the light direction. As shown in FIG. 9, the light emitted from the light-emitting unit 221 passes through the first surface 233 from the first optical body 230 to the second optical body 250; since the refractive index of the second optical body 250 is greater than the refractive index of the first optical body 230, a refraction angle β2 of the light in the second optical body 250 is greater than a refraction angle β1 of the light in the first optical body 230. Thus, it can be found that the light in the second optical body 250 deviates toward the direction perpendicular to the light-emitting substrate 200, thereby further improving the light extraction efficiency of the light-emitting substrate 200 in the direction perpendicular to the light-emitting substrate 200.

In some examples, in a case where the light-emitting substrate 200 includes the first optical bodies 230, the second optical bodies 250 and the common electrode layer 240, the refractive index of the common electrode layer 240 is greater than the refractive index of the first optical body 230, and the refractive index of the second optical body 250 is greater than the refractive index of the common electrode layer 240. For example, the refractive index of the first optical body 230 is 1.3, the refractive index of the common electrode layer 240 is 1.5, and the refractive index of the second optical body 250 is 2.0.

It can be seen from FIG. 9 that when the light irradiates from a structure with a low refractive index to a structure with a high refractive index, the light will deviate toward the direction perpendicular to the light-emitting substrate 200. In view of the above, when the light irradiates from the first optical body 230 to the common electrode layer 240, the refracted light will deviate toward the direction perpendicular to the light-emitting substrate 200 firstly; when the light irradiates from the common electrode layer 240 to the second optical body 250, the refracted light will further deviate toward the direction perpendicular to the light-emitting substrate 200. Thus, the light extraction efficiency of the light-emitting substrate 200 in the direction perpendicular to the light-emitting substrate 200 may be further improved.

In some examples, as shown in FIG. 4, an area of a surface of the second optical body 250 proximate to the backboard 210 is greater than an area of a surface of the second optical body 250 away from the backboard. It can be understood that an area of a light exit region of the second optical body 250 is smaller than an area of a light incident region of the second optical body 250, so that more light can be emitted from the first optical body 230, so as to improve the light extraction efficiency of the light-emitting substrate 200 in the direction perpendicular to the light exit surface of the light-emitting substrate 200.

Figure 10:
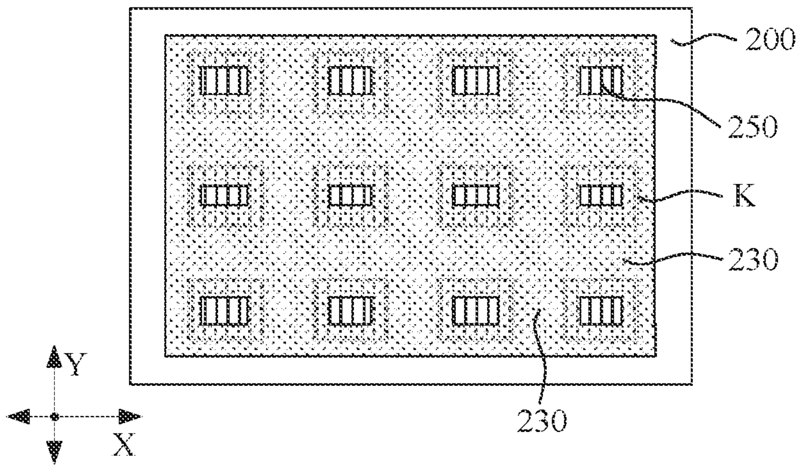
FIG. 10 is a diagram showing structures of first optical bodies and second optical bodies in a light-emitting substrate, in accordance with some embodiments.

As shown in FIG. 10, in some examples, the first optical bodies 230 and the second optical bodies 250 are alternately arranged in a direction parallel to an arrangement direction of a row of light emitting units 221. For example, the first optical bodies 230 and the second optical bodies 250 are alternately arranged in the first direction X. For another example, the first optical bodies 230 and the second optical bodies 250 are alternately arranged in the second direction Y.

As shown in FIG. 4, in some examples, a surface of the second optical body 250 away from the backboard 210 and a portion of a surface, away from the backboard 210, of the common electrode layer 240 constitute a continuous surface.

It will be understood that, in the third direction Z, a distance between the surface of the second optical body 250 away from the backboard 210 and the backboard 210 is approximately equal to a distance between the portion of the surface, away from the backboard 210, of the common electrode layer 240 and the backboard 210.

For example, a sum of a dimension of the second optical body 250 in the third direction X and a dimension of the common electrode layer 240 in the third direction X is approximately equal to a sum of the dimension of the common electrode layer 240 in the third direction X and a dimension of the second optical portion 232 in the third direction x.

Moreover, an edge of the surface of the second optical body 250 away from the backboard 210 is connected to an edge of a portion of the surface, away from the backboard 210, of the common electrode layer 240. For example, an orthographic projection of the surface of the second optical body 250 away from the backboard 210 on the backboard 210 is complementary to an orthographic projection of the portion of the surface, away from the backboard 210, of the common electrode layer 240 on the backboard 210.

In addition, since the common electrode layer 240 has an equal film thickness at different positions, it will be understood that the dimension of the second optical body 250 in the third direction X is approximately equal to the dimension of the second optical portion 232 in the third direction X.

The surface of the second optical body 250 away from the backboard 210 and the portion of the surface, away from the backboard 210, of the common electrode layer 240 constitute a continuous and flat surface, which may facilitate the fabrication of structures of the second optical body 250 and the common electrode layer 240 away from the backboard 210, so as to improve the fabrication yield of the light-emitting substrate 200.

As shown in FIGS. 4 and 5, in some embodiments, the light-emitting substrate 200 further includes an adhesive layer 280 and a cover plate 290. Both the adhesive layer 280 and the cover plate 290 cover the second optical bodies 250 and the common electrode layer 240.

In some examples, as shown in FIG. 4, the adhesive layer 280 is in direct contact with the surfaces of the second optical bodies 250 away from the backboard 210 and the surface of the common electrode layer 240 away from the backboard 210. The adhesive layer 280 is located between the second optical bodies 250 and the cover plate 290 to bond the cover plate 290 on the light-emitting substrate 200.

For example, the material of the light-emitting layer 280 may include a light-transmitting organic material. The adhesion layer 280 may include at least one of organic materials such as OCA, OCR, or the like. The cover plate 290 may include a light-transmitting glass cover plate. The light-transmitting glass cover is bonded to the light-emitting substrate 200 by the adhesive layer 280, thereby protecting the light-emitting units 221, the first optical bodies 230, and the second optical bodies 250 in the light-emitting substrate 200, and improving the reliability of the light-emitting substrate 200.

In some examples, the color conversion substrate 300 may be fabricated on a side of the cover plate 290 away from the backboard 210. For example, the color conversion substrate 300 is fabricated directly on the cover plate 290.

To sum up, in the light-emitting substrate 200 provided by the embodiments of the present disclosure, the light extraction efficiency of the light-emitting substrate 200 in a direction perpendicular to the light-emitting substrate 200 may be improved through cooperation of the first optical bodies 230 and the second optical bodies 250.

Figure 11:
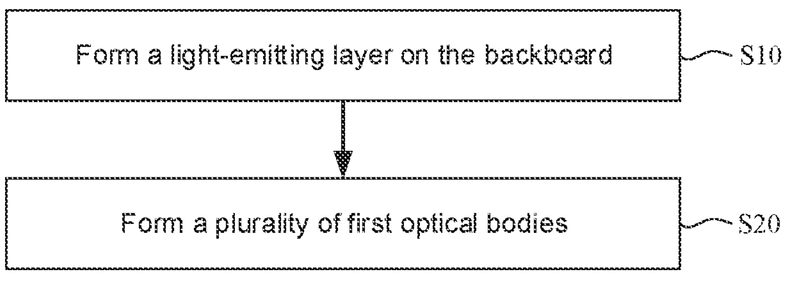
FIG. 11 is a flow diagram of a method of manufacturing a light-emitting substrate, in accordance with some embodiments.

Some embodiments of the present disclosure provide a method of manufacturing a light-emitting substrate. The manufacturing method may be used for manufacturing the light-emitting substrate 200 provided in some of the above embodiments. As shown in FIG. 11, the method of manufacturing a light-emitting substrate includes steps S10 and S20.

In the step S10, a light-emitting layer is formed on a backboard. The light-emitting layer includes a plurality of light-emitting units arranged at intervals.

Before the step S10, the backboard 210 is formed. Pixel circuits and control electrodes are formed in a plurality of light-emitting regions of the backboard 210. The plurality of light-emitting units formed in step S10 are respectively located in the plurality of light-emitting regions, and in the same light-emitting region, the control electrode is coupled to both the light-emitting unit 221 and the pixel circuit.

Figure 12:
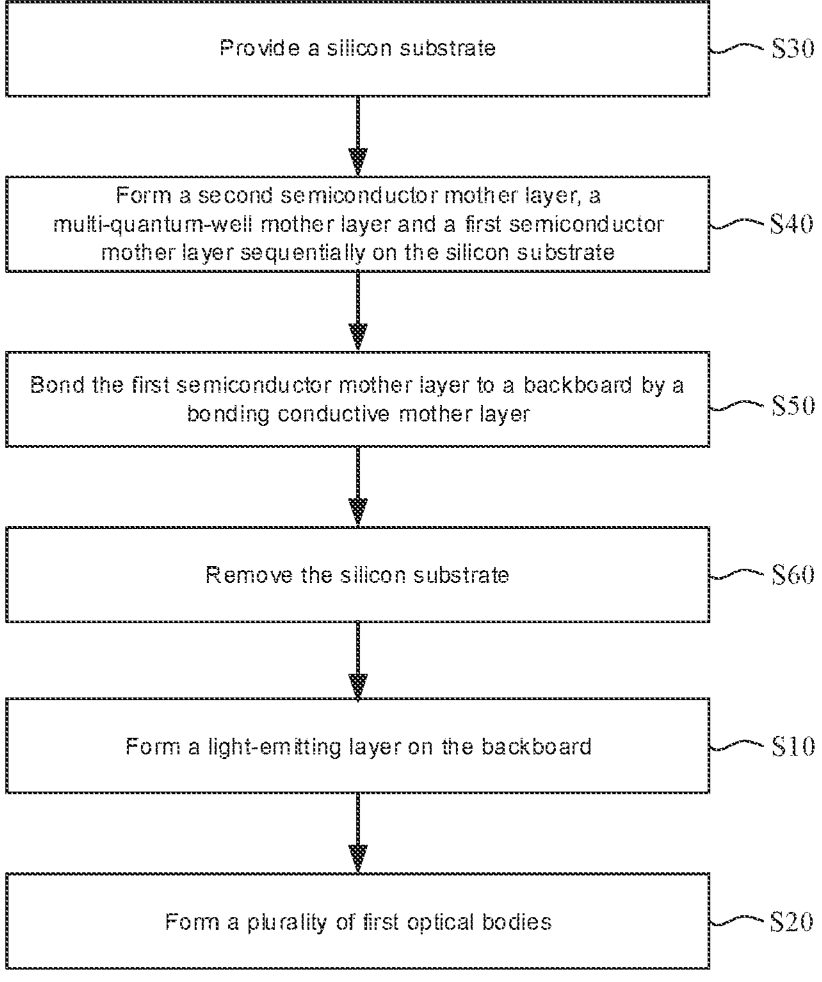
FIG. 12 is a flow diagram of another method of manufacturing a light-emitting substrate, in accordance with some embodiments.

In some embodiments, as shown in FIG. 12, before the step S10, the method further includes steps S30 to S60.

In the step S30, a silicon substrate 600 is provided.

The silicon substrate 600 has excellent thermal conductivity and electrical conductivity, which may facilitate fabrication of subsequent multiple film layers. Moreover, the cost of the silicon substrate 600 is relatively low, which may reduce the manufacturing cost of the light-emitting substrate 200.

In the step S40, a second semiconductor mother layer 320', a multi-quantum-well mother layer 330' and a first semiconductor mother layer 310' are sequentially formed on the silicon substrate 600.

Figure 13:
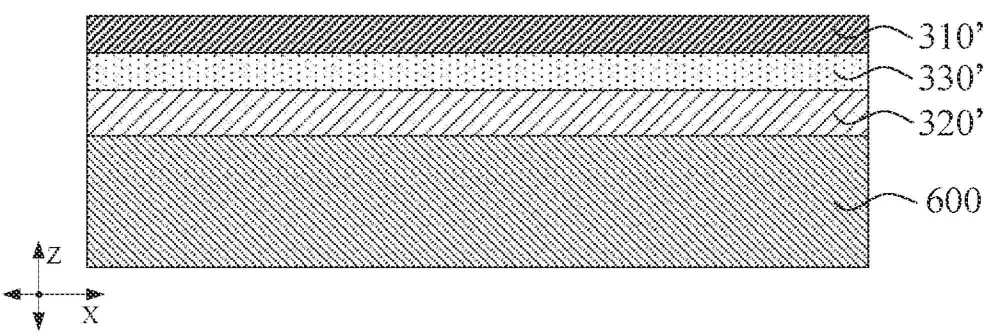
FIG. 13 is a diagram showing a structure in a manufacturing phase of a method of manufacturing a light-emitting substrate, in accordance with some embodiments.

As shown in FIG. 13, the second semiconductor mother layer 320, the multi-quantum-well mother layer 330' and the first semiconductor mother layer 310' may be sequentially grown on the silicon substrate 600 by means of selective epitaxy growth (SEG).

For example, a dimension of each of the silicon substrate 600, and the second semiconductor mother layer 320', the multi-quantum-well mother layer 330' and the first semiconductor mother layer 310' stacked sequentially on the silicon substrate 600 in the first direction X or the second direction Y may be 8 inches or 12 inches.

In the step S50, the first semiconductor mother layer is bonded to the backboard 210 by a bonding conductive mother layer. The bonding conductive mother layer is located between the first semiconductor mother layer and the backboard.

Figure 14:
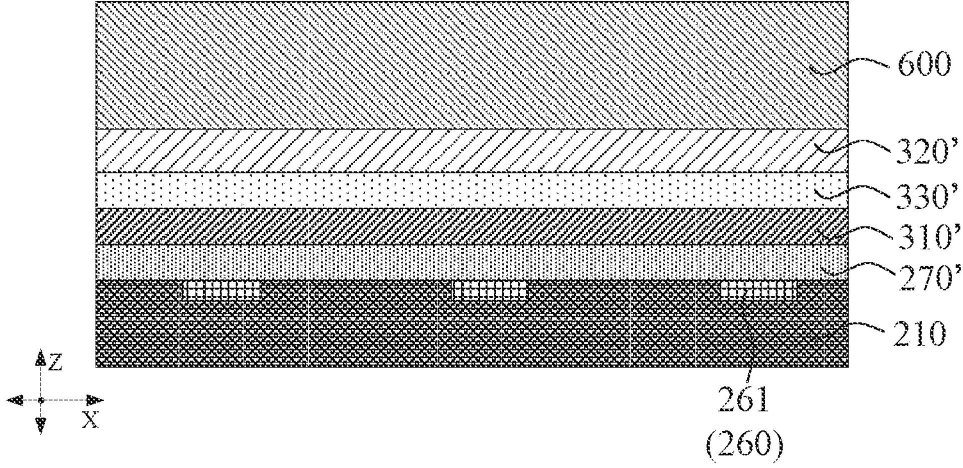
FIG. 14 is a diagram showing a structure in another manufacturing phase of a method of manufacturing a light-emitting substrate, in accordance with some embodiments.

The bonding conductive mother layer 270' may be formed on the backboard 210 first, so as to be coupled to the plurality of control electrodes in the backboard 210. Next, the first semiconductor mother layer 310' grown in step S40 is connected to the bonding conductive mother layer 270'. Then, the bonding between the backboard 210 and the first semiconductor mother layer 310' is achieved by the bonding conductive mother layer 270' and by means of eutectic bonding or thermocompression bonding, as shown in FIG. 14.

Temperature during the bonding process may be in a range of 100° C. to 400° C., such as 100° C., 150° C., 200° C., 250° C., 300° C., 350° C. or 400° C. The bonding conductive mother layer 270' may include at least one of copper-stannum (Cu—Sn) alloy, stannum-silver (Sn—Ag) alloy, stannum-indium (Sn—In) alloy, stannum-aurum (Sn—Au) alloy, aurum-indium (Au—In) alloy, and copper-indium (Cu—In) alloy.

It will be noted that the pixel circuits and a control electrode layer 260 may have been fabricated in the backboard 210 before the step S50, and the control electrode layer 260 may include the plurality of control electrodes 261.

In the step S60, the silicon substrate 600 is removed.

Figure 15:
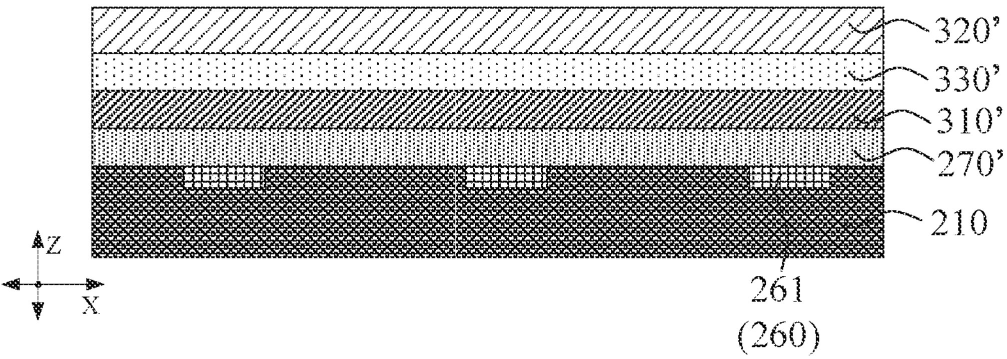
FIG. 15 is a diagram showing a structure in yet another manufacturing phase of a method of manufacturing a light-emitting substrate, in accordance with some embodiments.

As shown in FIG. 15, for example, the bonded structure manufactured in the step S50 is soaked in a hydrogen fluoride (HF) solution to remove the silicon substrate 600.

In this embodiment, the second semiconductor mother layer 320', the multi-quantum-well mother layer 330' and the first semiconductor mother layer 310' are formed on the silicon substrate 600, and the silicon substrate 600 is removed after bonding. In this way, a dimension of the light-emitting substrate 200 in the third direction Z may be thinned, which facilitates the thinness of the display panel 100.

Meanwhile, before patterning the second semiconductor mother layer 320', the multi-quantum-well mother layer 330' and the first semiconductor mother layer 310', the second semiconductor mother layer 320', the multi-quantum-well mother layer 330' and the first semiconductor mother layer 310' are transferred onto the backboard 210, which may avoid the problems of the reduction of the manufacturing yield and the low transfer efficiency of the light-emitting units 221 that are caused by a fact that the second semiconductor mother layer 320', the multi-quantum-well mother layer 330' and the first semiconductor mother layer 310' are transferred after being patterned, so that the manufacturing yield and manufacturing efficiency of the light-emitting substrate 200 are improved.

Figure 16:
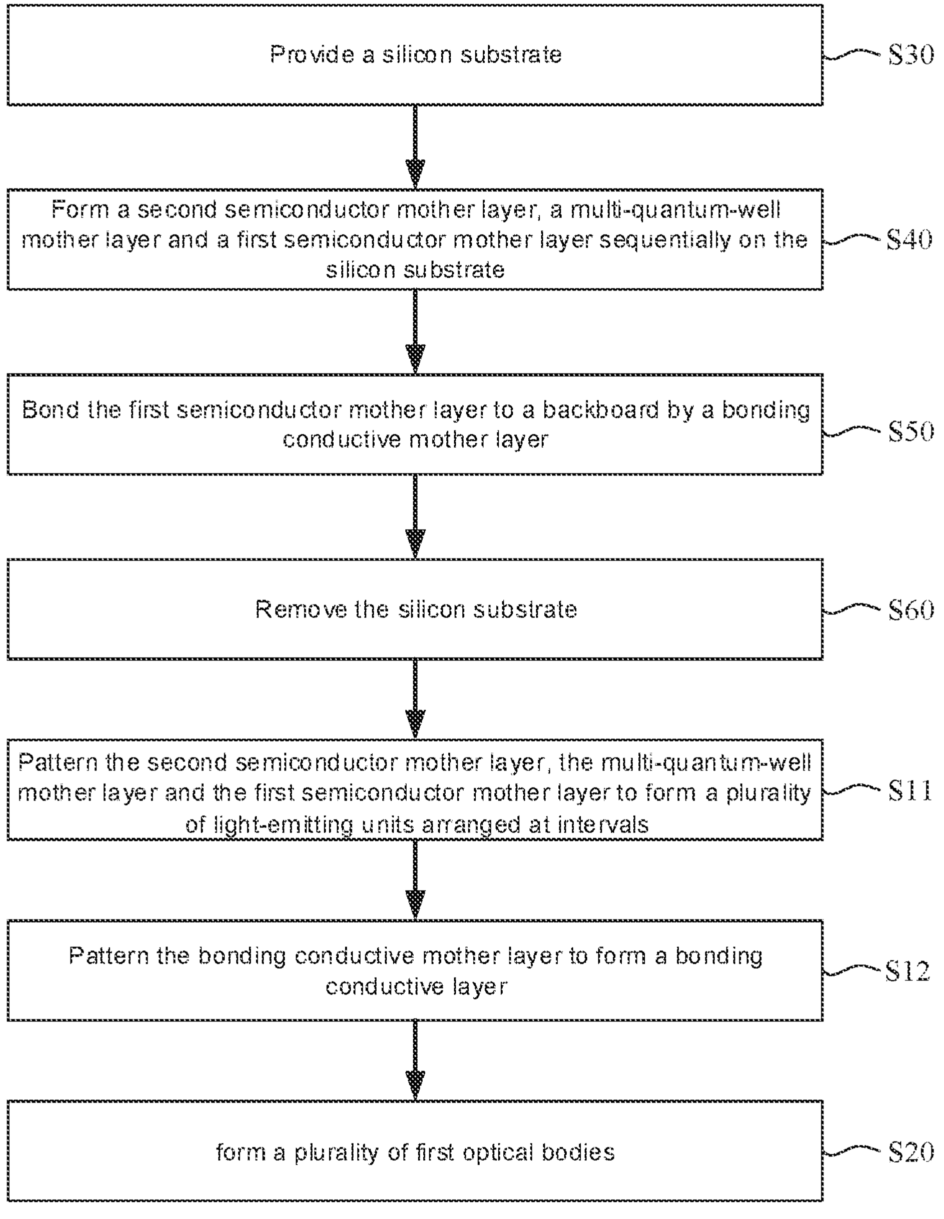
FIG. 16 is a flow diagram of yet another method of manufacturing a light-emitting substrate, in accordance with some embodiments.

In some examples, as shown in FIG. 16, the step S10 includes steps S11 and S12.

In the step S11, the second semiconductor mother layer 320', the multi-quantum-well mother layer 330' and the first semiconductor mother layer 310' are patterned to form a plurality of light-emitting units 221 arranged at intervals.

In some examples, the second semiconductor mother layer 320', the multi-quantum-well mother layer 330' and the first semiconductor mother layer 310' may be patterned by etching. For example, the second semiconductor mother layer 320', the multi-quantum-well mother layer 330' and the first semiconductor mother layer 310' may be patterned simultaneously by dry etching. For another example, the second semiconductor mother layer 320, the multi-quantum-well mother layer 330' and the first semiconductor mother layer 310' may be patterned respectively by wet etching.

Figure 17:
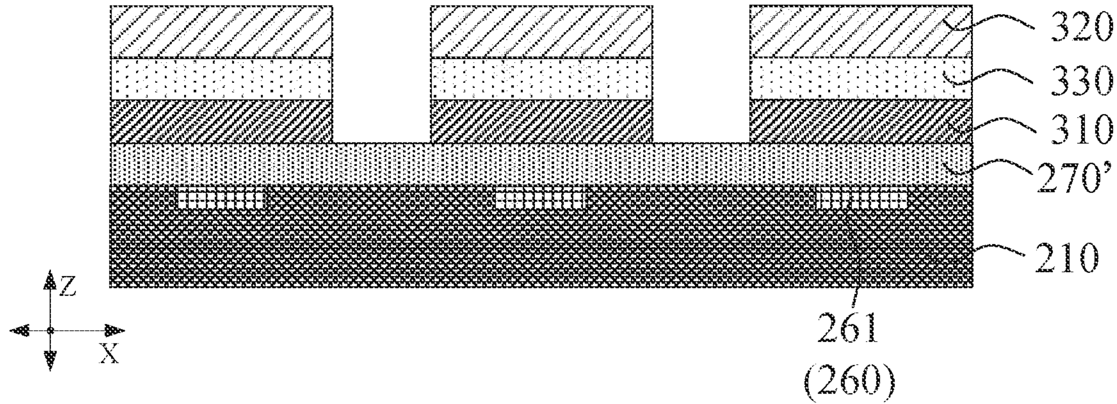
FIG. 17 is a diagram showing a structure in yet another manufacturing phase of a method of manufacturing a light-emitting substrate, in accordance with some embodiments.

As shown in FIG. 17, the patterned second semiconductor mother layer 320' includes a plurality of second semiconductor layers 320; the patterned multi-quantum-well mother layer 330' includes a plurality of multi-quantum-well layers 330; the patterned first semiconductor mother layer 310' includes a plurality of first semiconductor layers 310. A second semiconductor layer 320, a multi-quantum-well layer 330 and a first semiconductor layer 310 that are located in a same light-emitting region and stacked constitute a light-emitting unit 221.

In the step S12, the bonding conductive mother layer 270' is patterned to form a bonding conductive layer 270; the bonding conductive layer 270 includes a plurality of bonding conductive portions 271 arranged at intervals from one other. The plurality of bonding conductive portions 271 are coupled to the plurality of light emitting units 221 respectively.

In some examples, the bonding conductive mother layer 270' may be patterned by etching, and the etching may be dry etching or wet etching, which is not limited here.

Figure 18:
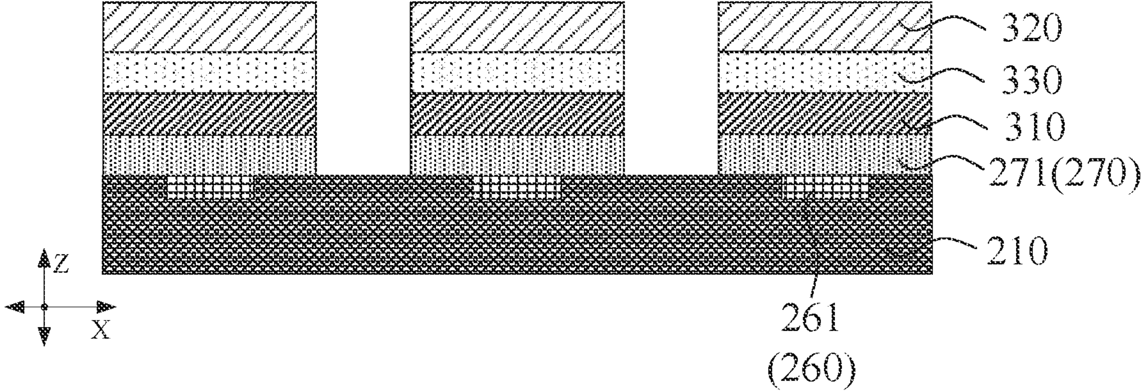
FIG. 18 is a diagram showing a structure in yet another manufacturing phase of a method of manufacturing a light-emitting substrate, in accordance with some embodiments.

As shown in FIG. 18, the patterned bonding conductive mother layer 270' forms the bonding conductive layer 270, and the bonding conductive layer 270 includes a plurality of bonding conductive portions 271 distributed in a plurality of light-emitting regions. In a light-emitting region, a bonding conductive portion 271 located is coupled to a light-emitting unit 221, so as to transmit a second voltage provided by a pixel circuit to the light-emitting unit 221.

In this embodiment, the second semiconductor mother layer 320, the multi-quantum-well mother layer 330' and the first semiconductor mother layer 310' are patterned, and then the bonding conductive mother layer 270' is patterned, so as to form a plurality of light-emitting units 221 that are separated from one another and the bonding conductive portions 271 respectively coupled to all the light-emitting units 221. An impedance of the second voltage may be reduced by using the bonding conductive portion 271, so that the light extraction efficiency of the light-emitting unit 221 may be improved.

In the step S20, a plurality of first optical bodies are formed. Each first optical body includes a first optical portion and a second optical portion; a gap between two adjacent light-emitting units is filled with the first optical portion, and the second optical portion is located on a side of the light-emitting layer away from the backboard and is connected to the first optical portion. The second optical portion includes first surfaces each extending outward from an edge of the first optical portion.

Figure 19:
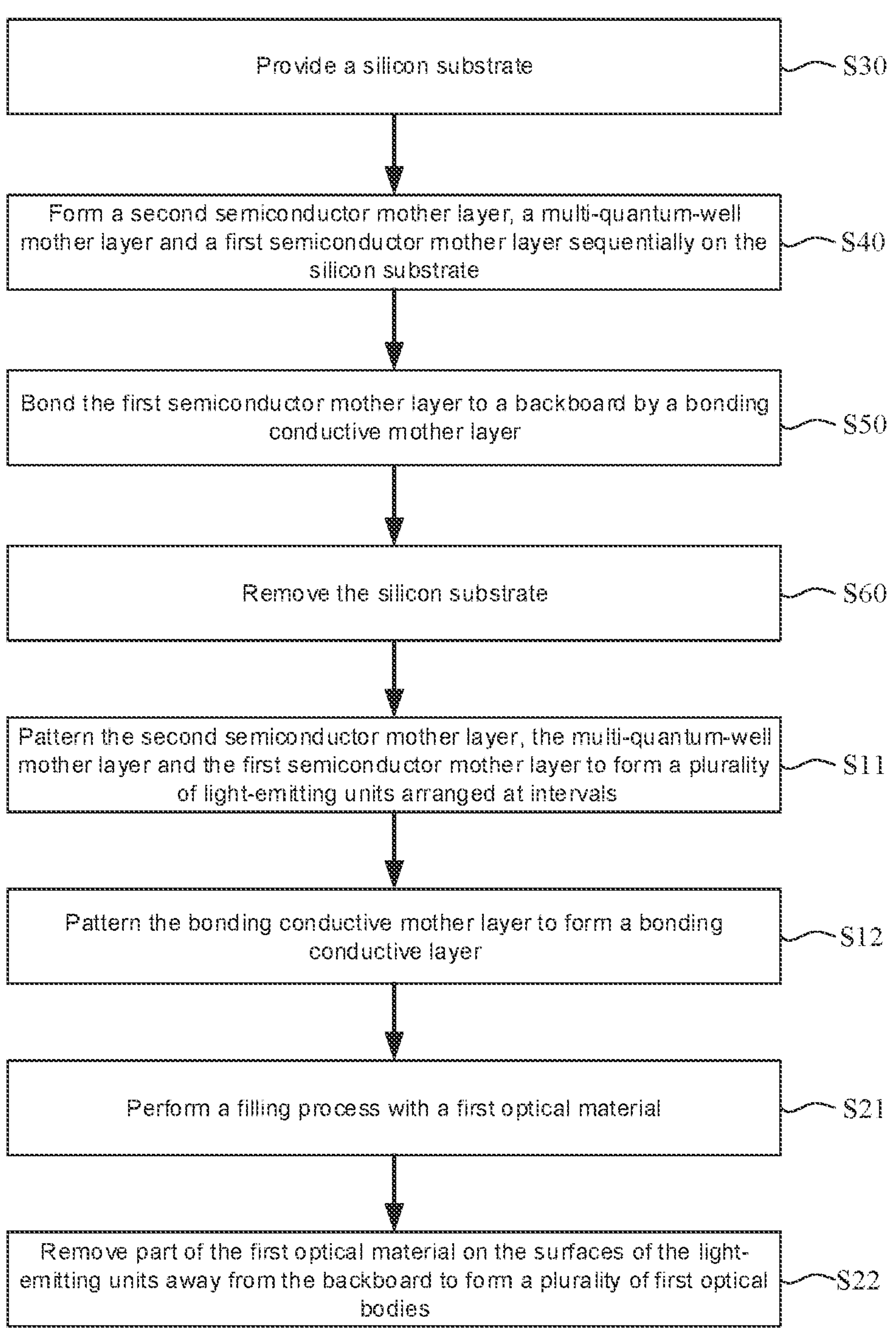
FIG. 19 is a flow diagram of yet another method of manufacturing a light-emitting substrate, in accordance with some embodiments.

In some examples, as shown in FIG. 19, the step S20 includes steps S21 and S22.

Figure 20:
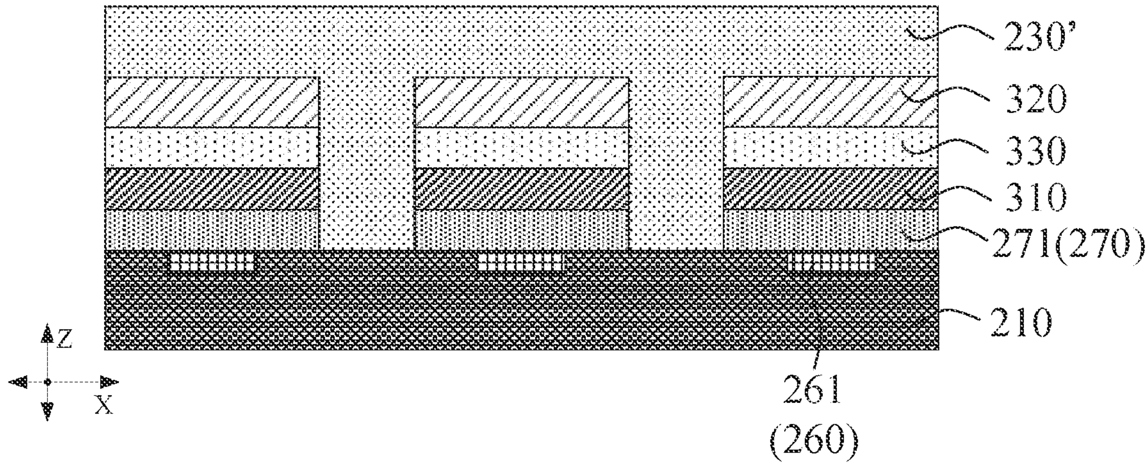
FIG. 20 is a diagram showing a structure in yet another manufacturing phase of a method of manufacturing a light-emitting substrate, in accordance with some embodiments.

In the step S21, a filling process is performed with a first optical material 230'. As shown in FIG. 20, a gap between every two adjacent light-emitting units 221 is filled with the first optical material 230', and the first optical material 230' covers the surfaces of the plurality of light-emitting units 221 away from the backboard 210.

In some examples, the first optical material 230' may be deposited by a deposition process, so that the gap between every two adjacent light-emitting units 221 is filled with the first optical material 230', and the first optical material 230' covers the surfaces of the plurality of light-emitting units 221 away from the backboard 210. The deposition process includes but not limited to chemical vapor deposition (CVD), physical vapor deposition (PVD), atomic layer deposition (ALD) or any combination thereof.

A refractive index of the first optical material 230' may be in a range of 1.3 to 1.7, such as 1.3, 1.4, 1.5, 1.6 or 1.7.

In the step S22, part of the first optical material 230' on the surfaces of the light-emitting units 221 away from the backboard is removed, so as to form a plurality of first optical bodies 230.

Figure 21:
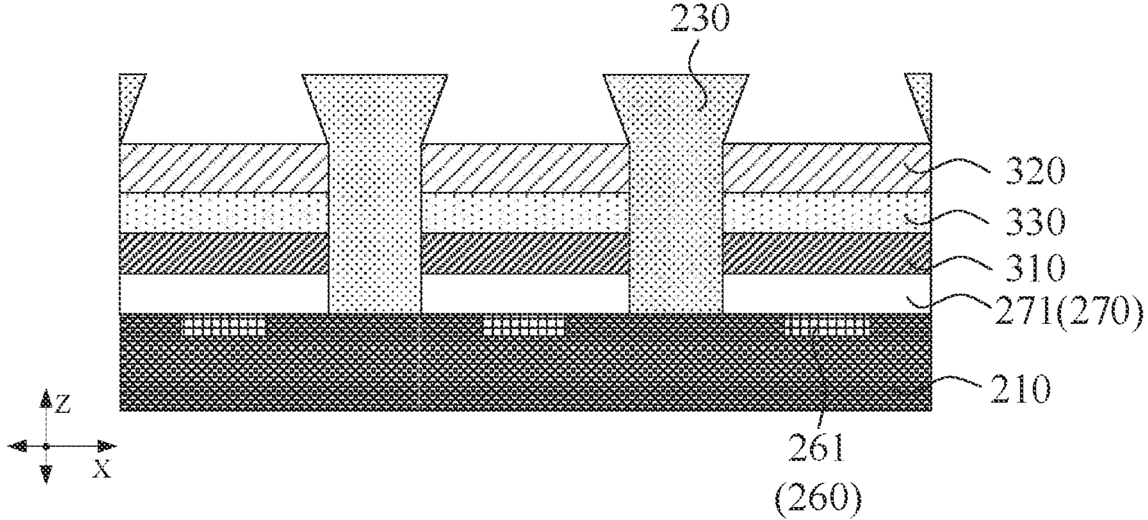
FIG. 21 is a diagram showing a structure in yet another manufacturing phase of a method of manufacturing a light-emitting substrate, in accordance with some embodiments.

As shown in FIG. 21, in some examples, part of the first optical material 230' on the surfaces of the light-emitting units 221 away from the backboard 210 may be removed by etching, and the first optical material 230' between every two adjacent light-emitting units 221 may be reserved. The first optical material 230' between every two adjacent light-emitting units 221 forms a first optical portion 231, and the reserved first optical material 230' on the surface of the light-emitting unit 221 away from the backboard 210 forms the second optical portion 232. The second optical portion 232 includes first surfaces 233 each extending outward from the edge of the first optical portion 231.

Figure 22:
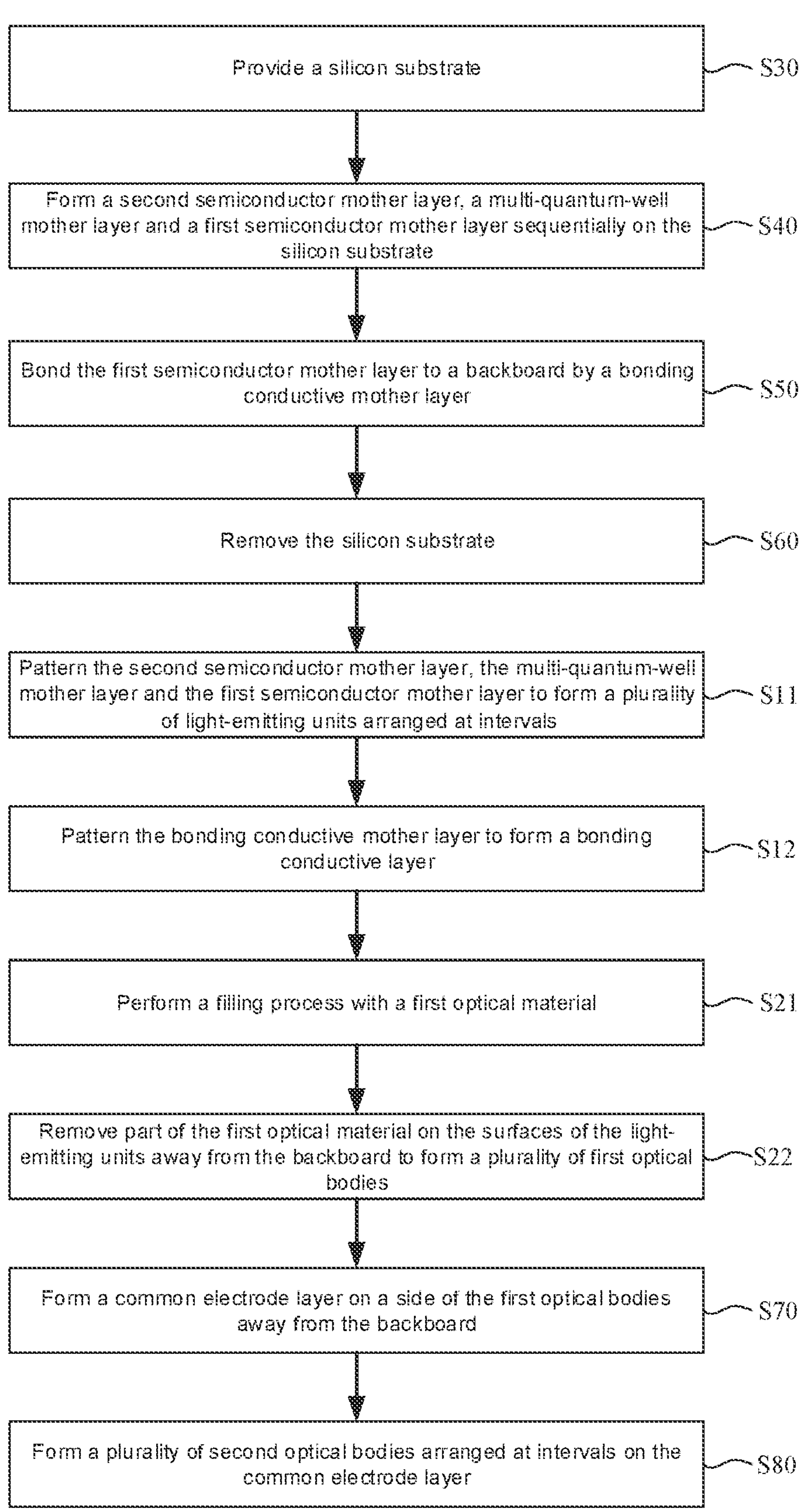
FIG. 22 is a flow diagram of yet another method of manufacturing a light-emitting substrate, in accordance with some embodiments.

In some embodiments, as shown in FIG. 22, after the step S20, the method further includes steps S70 and S80.

In the step S70, a common electrode layer 240 is formed on a side of the first optical bodies 230 away from the backboard 210. The common electrode layer 240 covers the plurality of light-emitting units 221 and the plurality of first optical bodies 230.

Figure 23:
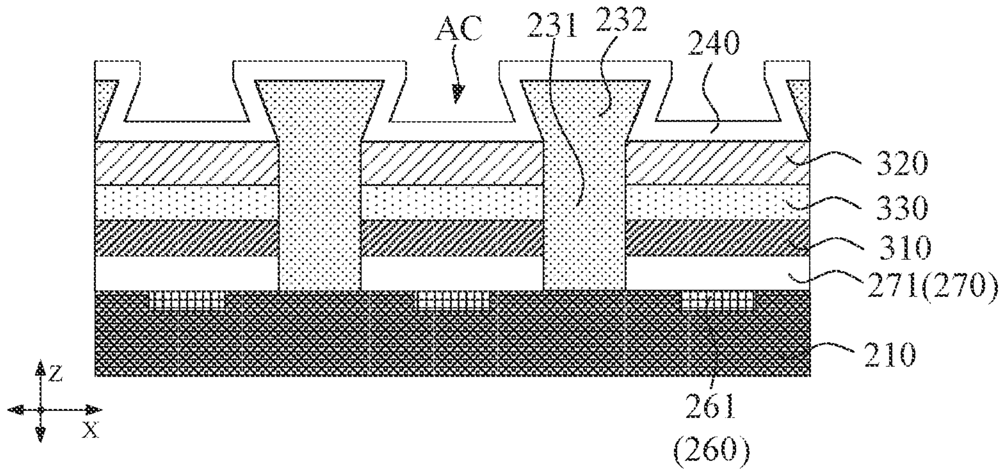
FIG. 23 is a diagram showing a structure in yet another manufacturing phase of a method of manufacturing a light-emitting substrate, in accordance with some embodiments.

In some examples, as shown in FIG. 23, a conductive material may be deposited by a deposition process to cover the plurality of light-emitting units 221 and the plurality of first optical bodies 230, so as to form the common electrode layer 240. The deposition process is, for example, an ALD process.

A dimension of the common electrode layer 240 in the third direction Z may be in a range of 500 Å to 1000 Å, such as 500 Å, 550 Å, 600 Å, 650 Å, 700 Å, 750 Å, 800 Å, 850 Å, 900 Å, 950 Å, or 1000 Å.

Since the dimension of the second optical portion 232 in the first direction X is larger than the dimension of the first optical portion 231 in the first direction X, it is easy to cause the common electrode layer 240 to break at the first surfaces 233. By increasing the dimension of the common electrode layer 240 in the third direction Z, the dimension of the common electrode layer 240 in the third direction Z is in the range of 500 Å to 1000 Å, so that it is possible to prevent the common electrode layer 240 from breaking at the first surfaces 233, so as to improve the reliability of the light-emitting substrate 200.

In the step S80, a plurality of second optical bodies 250 arranged at intervals are formed on the common electrode layer 240. An orthogonal projection of a second optical body 250 on the backboard 210 is within an orthogonal projection of a light-emitting unit 221 on the backboard 210.

The dimension of the second optical portion 232 in the first direction X is larger than the dimension of the first optical portion 231 in the first direction X, and the common electrode layer 240 has a film structure with a uniform film thickness. Therefore, as shown in FIG. 23, a groove AC is formed in the common electrode layer 240 on the light-emitting unit 221.

Figure 24:
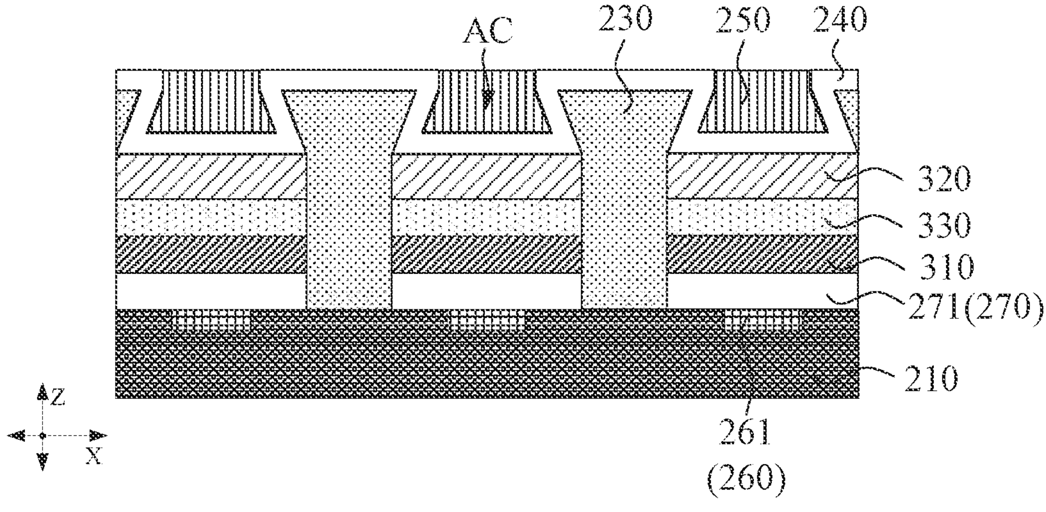
FIG. 24 is a diagram showing a structure in yet another manufacturing phase of a method of manufacturing a light-emitting substrate, in accordance with some embodiments.

In some examples, as shown in FIG. 24, a second optical material may be deposited by a deposition process. The second optical material covers the common electrode layer 240, and the grooves AC are filled with the second optical material. Next, the second optical material outside the grooves AC may be removed by an etching process, and the second optical material remaining in the groove AC forms the second optical body 250.

In some embodiments, a refractive index of the second optical material is greater than a refractive index of the first optical material. For example, the refractive index of the second optical material is in a range from 1.5 to 2.2, such as 1.5, 1.7, 1.9, 2.0, 2.1 or 2.2.

Since the refractive index of the second optical material is greater than the refractive index of the first optical material, the light emitted from the first optical body 230 to the second optical body 250 will be refracted so that the light is emitted deviating toward a direction perpendicular to the light-emitting substrate 200. Thus, the light extraction efficiency of the light-emitting substrate 200 in a direction perpendicular to the light-emitting substrate 200 is improved, and the display brightness upon the front of the display panel 100 is improved.

In summary, the light-emitting substrate 200 manufactured by the method of manufacturing the light-emitting substrate provided by the embodiments of the present disclosure has a high light extraction efficiency in the direction perpendicular to the light-emitting substrate 200, which may improve the display brightness upon the front of the display panel 100.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A light-emitting substrate, comprising:

a backboard;

a light-emitting layer located on a side of the backboard; wherein the light-emitting layer includes a plurality of light-emitting units, and the plurality of light-emitting units are arranged in an array; and a plurality of first optical bodies; wherein each first optical body includes a first optical portion and a second optical portion; a gap between two adjacent light-emitting units is filled with the first optical portion, and the second optical portion is located on a side of the light-emitting layer away from the backboard, and is connected to the first optical portion; the second optical portion includes a first surface extending outwards from an edge of the first optical portion; and the light-emitting substrate further comprising:

a control electrode layer including a plurality of control electrodes; wherein the plurality of control electrodes are respectively coupled to the plurality of light-emitting units; wherein the control electrode layer is at least partially located in the backboard; or the light-emitting substrate further comprising:

a control electrode layer including a plurality of control electrodes; wherein the plurality of control electrodes are respectively coupled to the plurality of light-emitting units; wherein the control electrode layer is at least partially located in the backboard; and a bonding conductive layer located between the light-emitting layer and the backboard; wherein the bonding conductive layer includes a plurality of bonding conductive portions, and a bonding conductive portion is coupled to a control electrode and a light-emitting unit.

2. The light-emitting substrate according to claim 1, wherein an orthographic projection of the first surface on the backboard is located within an orthographic projection of a light-emitting unit of the two adjacent light-emitting units on the backboard.

3. The light-emitting substrate according to claim 1, wherein orthographic projections, on the backboard, of first surfaces of at least two first optical bodies are located within an orthographic projection of a same light-emitting unit on the backboard.

4. The light-emitting substrate according to claim 1, wherein a slope angle of the first surface relative to the backboard is in a range of 40° to 80°.

5. The light-emitting substrate according to claim 1, further comprising:

a common electrode layer located on the side of the light-emitting layer away from the backboard; wherein the common electrode layer covers the plurality of light-emitting units and the plurality of first optical bodies.

6. The light-emitting substrate according to claim 5, further comprising:

a plurality of second optical bodies; wherein the plurality of second optical bodies are located on a surface of the common electrode layer away from the backboard.

7. The light-emitting substrate according to claim 6, wherein an area of a surface, proximate to the backboard, of the second optical body is greater than an area of a surface, away from the backboard, of the second optical body.

8. The light-emitting substrate according to claim 6, wherein the plurality of light-emitting units are arranged in a plurality of rows and a plurality of columns; wherein in a direction parallel to an arrangement direction of a row of light-emitting units, first optical bodies and second optical bodies are alternately arranged; and/or in a direction parallel to an arrangement direction of a column of light-emitting units, first optical bodies and second optical bodies are alternately arranged.

9. The light-emitting substrate according to claim 6, wherein a surface of the second optical body away from the backboard and a portion of the surface of the common electrode layer away from the backboard constitute a continuous surface.

10. The light-emitting substrate according to claim 6, wherein a refractive index of a second optical body is greater than a refractive index of a first optical body, a refractive index of the common electrode layer is greater than the refractive index of the first optical body, and the refractive index of the second optical body is greater than the refractive index of the common electrode layer; and an orthographic projection of the second optical body on the backboard is located within an orthographic projection of a light-emitting unit on the backboard.

11. The light-emitting substrate according to claim 1, wherein a light-emitting unit includes:

a first semiconductor layer, a multi-quantum-well layer and a second semiconductor layer that are sequentially stacked in a direction away from the backboard; wherein the first semiconductor layer includes a P-type doped material, and the second semiconductor layer includes an N-type doped material.

12. The light-emitting substrate according to claim 11, wherein the light-emitting substrate further comprises second optical bodies and a common electrode layer; wherein a refractive index of the common electrode layer, a refractive index of a first optical body and a refractive index of a second optical body are all less than a refractive index of the second semiconductor layer.

13. The light-emitting substrate according to claim 1, further comprising:

an adhesive layer located on a side of the first optical bodies away from the backboard; and a cover plate located on a side of the adhesive layer away from the backboard and covering the light-emitting layer and the first optical bodies.

14. A display panel, comprising the light-emitting substrate according to claim 1.

15. A method of manufacturing a light-emitting substrate, comprising:

forming a light-emitting layer on a backboard; wherein the light-emitting layer includes a plurality of light-emitting units that are arranged at intervals; and forming a plurality of first optical bodies; wherein each first optical body includes a first optical portion and a second optical portion; a gap between two adjacent light-emitting units is filled with the first optical portion, and the second optical portion is located on a side of the light-emitting layer away from the backboard, and is connected to the first optical portion; the second optical portion includes a first surface extending outwards from an edge of the first optical portion; and before the light-emitting layer is formed on the backboard, the method further comprising: forming a control electrode layer on a backboard, wherein the control electrode layer includes a plurality of control electrodes, the plurality of control electrodes are respectively coupled to the plurality of light-emitting units, and the control electrode layer is at least partially located in the backboard;

or, before the light-emitting layer is formed on the backboard, the method further comprising: forming a control electrode layer on a backboard, wherein the control electrode layer includes a plurality of control electrodes, the plurality of control electrodes are respectively coupled to the plurality of light-emitting units, and the control electrode layer is at least partially located in the backboard; and before the light-emitting layer is formed on the backboard, the method further comprising:

providing a silicon substrate;

forming a second semiconductor mother layer, a multi-quantum-well mother layer and a first semiconductor mother layer sequentially on the silicon substrate;

bonding the first semiconductor mother layer to the backboard by a bonding conductive mother layer, wherein the bonding conductive mother layer is located between the first semiconductor mother layer and the backboard; and removing the silicon substrate, wherein forming the light-emitting layer on the backboard includes:

patterning the second semiconductor mother layer, the multi-quantum-well mother layer and the first semiconductor mother layer to form the plurality of light-emitting units that are arranged at intervals; and patterning the bonding conductive mother layer to form a bonding conductive layer, wherein the bonding conductive layer includes a plurality of bonding conductive portions that are arranged at intervals, and a bonding conductive portion is coupled to a control electrode and a light-emitting unit.

16. The light-emitting substrate according to claim 4, wherein the first surface is a plane.

17. The light-emitting substrate according to claim 6, wherein the plurality of first optical bodies are each in direct contact with the common electrode layer; and the plurality of second optical bodies are each in direct contact with the common electrode layer.

18. The light-emitting substrate according to claim 11, wherein in a case where the light-emitting substrate further comprises the control electrode layer and the bonding conductive layer, the control electrode layer is entirely located in the backboard, and a surface of the control electrode toward the light-emitting layer is flush with a surface of the backboard toward the light-emitting layer; and each first optical body is in direct contact with the two adjacent light-emitting units, the bonding conductive layer and the backboard.

19. The light-emitting substrate according to claim 1, wherein the backboard is a silicon substrate.

20. The light-emitting substrate according to claim 1, wherein the control electrode layer is entirely located in the backboard, and a surface of the control electrode toward the light-emitting layer is flush with a surface of the backboard toward the light-emitting layer.

* * * * *